United States Patent
Berkley et al.

(10) Patent No.: US 10,938,346 B2
(45) Date of Patent: Mar. 2, 2021

(54) FREQUENCY MULTIPLEXED RESONATOR INPUT AND/OR OUTPUT FOR A SUPERCONDUCTING DEVICE

(71) Applicant: D-Wave Systems Inc., Burnaby (CA)

(72) Inventors: Andrew J. Berkley, Vancouver (CA); Loren J. Swenson, Burnaby (CA); Mark H. Volkmann, North Vancouver (CA); Jed D. Whittaker, Vancouver (CA); Paul I. Bunyk, New Westminster (CA); Peter D. Spear, Burnaby (CA); Christopher B. Rich, Vancouver (CA)

(73) Assignee: D-WAVE SYSTEMS INC., Burnaby (CA)

( * ) Notice: Subject to any disclaimer, the term of this patent is extended or adjusted under 35 U.S.C. 154(b) by 480 days.

(21) Appl. No.: 15/572,731

(22) PCT Filed: May 11, 2016

(86) PCT No.: PCT/US2016/031885
§ 371 (c)(1),
(2) Date: Nov. 8, 2017

(87) PCT Pub. No.: WO2016/183213
PCT Pub. Date: Nov. 17, 2016

(65) Prior Publication Data
US 2018/0145631 A1    May 24, 2018

Related U.S. Application Data

(60) Provisional application No. 62/288,251, filed on Jan. 28, 2016, provisional application No. 62/161,780, filed on May 14, 2015.

(51) Int. Cl.
*H03B 15/00* (2006.01)
*H01L 39/22* (2006.01)
(Continued)

(52) U.S. Cl.
CPC ......... *H03B 15/003* (2013.01); *H01L 39/223* (2013.01); *H01P 7/08* (2013.01);
(Continued)

(58) Field of Classification Search
CPC ..... H03B 15/003; H01L 39/223; H01P 7/105; H01P 7/08; H01P 7/01
See application file for complete search history.

(56) References Cited

U.S. PATENT DOCUMENTS 4,785,426 A * 11/1988 Harada ................... G11C 11/44
327/528
5,528,202 A    6/1996 Moline et al.
(Continued)

FOREIGN PATENT DOCUMENTS

WO    2005109565 A1    11/2005
WO    2014/135749 A1    9/2014

OTHER PUBLICATIONS

International Search Report, dated Sep. 30, 2016, for PCT/US2016/031885, 4 pages.
(Continued)

*Primary Examiner* — Dean O Takaoka
*Assistant Examiner* — Alan Wong
(74) *Attorney, Agent, or Firm* — Cozen O'Connor

(57) ABSTRACT

A superconducting input and/or output system employs at least one microwave superconducting resonator. The microwave superconducting resonator(s) may be communicatively coupled to a microwave transmission line. Each microwave superconducting resonator may include a first and a second DC SQUID, in series with one another and with an inductance (e.g., inductor), and a capacitance in parallel with the first and second DC SQUIDs and inductance. Respective inductive interfaces are operable to apply flux bias to control the DC SQUIDs. The second DC SQUID (Continued)

may be coupled to a Quantum Flux Parametron (QFP), for example as a final element in a shift register. A superconducting parallel plate capacitor structure and method of fabricating such are also taught.

19 Claims, 22 Drawing Sheets

(51) Int. Cl.
*H01P 7/08* (2006.01)
*H01P 7/10* (2006.01)
*H03H 7/01* (2006.01)
*G06N 10/00* (2019.01)

(52) U.S. Cl.
CPC ............... *H01P 7/105* (2013.01); *H03H 7/01* (2013.01); *G06N 10/00* (2019.01); *H03B 2201/02* (2013.01)

(56) References Cited

U.S. PATENT DOCUMENTS

| | | | |
|---|---|---|---|
| 6,356,078 | B1 | 3/2002 | Ganther et al. |
| 7,624,088 | B2 | 11/2009 | Johnson et al. |
| 7,843,209 | B2 | 11/2010 | Berkley |
| 7,876,248 | B2 | 1/2011 | Berkley et al. |
| 7,932,514 | B2 * | 4/2011 | Farinelli ............... G06N 10/00 257/31 |
| 8,018,244 | B2 | 9/2011 | Berkley |
| 8,098,179 | B2 | 1/2012 | Bunyk et al. |
| 8,169,231 | B2 | 5/2012 | Berkley |
| 8,536,566 | B2 | 9/2013 | Johansson et al. |
| 8,786,476 | B2 | 7/2014 | Bunyk et al. |
| 8,854,074 | B2 | 10/2014 | Berkley |
| 8,933,695 | B1 | 1/2015 | Kornev et al. |
| 8,951,808 | B2 | 2/2015 | Ladzinsky et al. |
| 9,509,274 | B2 * | 11/2016 | Naaman ............... H01P 1/18 |
| 10,050,630 | B2 * | 8/2018 | Reagor ............... H03K 19/195 |
| 10,333,047 | B2 | 6/2019 | Gilbert et al. |
| 10,381,542 | B2 | 8/2019 | Chang et al. |
| 10,404,214 | B2 * | 9/2019 | Szocs ............... H03F 19/00 |
| 2002/0190381 | A1 | 12/2002 | Herr et al. |
| 2004/0155728 | A1 | 8/2004 | Cheung et al. |
| 2004/0170047 | A1 | 9/2004 | Amin et al. |
| 2009/0082209 | A1 | 3/2009 | Bunyk et al. |
| 2009/0206871 | A1 | 8/2009 | Baumgardner et al. |
| 2009/0319757 | A1 | 12/2009 | Berkley |
| 2011/0060780 | A1 | 3/2011 | Berkley et al. |
| 2015/0032994 | A1 | 1/2015 | Chudak et al. |
| 2015/0111754 | A1 | 4/2015 | Harris et al. |
| 2015/0119252 | A1 | 4/2015 | Ladizinsky et al. |
| 2016/0079968 | A1 | 3/2016 | Strand et al. |
| 2016/0112031 | A1 | 4/2016 | Abraham et al. |
| 2016/0233860 | A1 | 8/2016 | Naaman |

OTHER PUBLICATIONS

Written Opinion, dated Sep. 30, 2016, for PCT/US2016/031885, 9 pages.
Barends, R. et al., "Coherent Josephson qubit suitable for scalable quantum integrated circuits," arXiv:1304.2322v1 [quant-ph], Apr. 8, 2013, 10 pages.
Bronn, Nicholas T. et al., "Reducing Spontaneous Emission in Circuit Quantum Electrodynamics by a Combined Readout/Filter Technique," arXiv:1504.04353v1 [quant-ph], Apr. 16, 2015, 8 pages
Bunyk, P.I. et al., "Architectural considerations in the design of a superconducting quantum annealing processor," arXiv:1401.5504v1 [quant-ph], Jan. 21, 2014, 9 pages.
Casas, J. et al., "A Quantum Flux Parametron (QFP) 12-Bit Shift Register Capable of Stable Microwave Frequency Operation," Japanese Journal of Applied Physics vol. 30, No. 12B, Dec. 1991, pp. 3939-3942.
Chen, Y. et al., "Multiplexed dispersive readout of superconducting phase qubits," arXiv:1209.1781v1 [cond-mat.supr-con], Sep. 9, 2012, 4 pages.
Colless, J.I. et al, "Cryogenic High-Frequency Readout and Control Platform for Spin Qubits," arXiv:1111.6440v2 [cond-mat.mes-hall], Nov. 29, 2011, 8 pages.
Day, P. et al., "A broadband superconducting detector suitable for use in large arrays," Letters to Nature, Nature, vol. 425, Oct. 23, 2003, pp. 817-821.
DiCarlo, L. et al., "Preparation and Measurement of Three-Qubit Entanglement in a Superconducting Circuit," arXiv:1004.4324v1 [cond-mat.mes-hall,] Apr. 25, 2010, 9 pages.
Gao, J. "The Physics of Superconducting Microwave Resonators," Thesis, In Partial Fulfillment of the Requirements for the Degree of Doctor of Philosophy, California Institute of Technology Pasadena, California, May 28, 2008, 197 pages.
Hornibrook, J. M. et al., "Frequency multiplexing for readout of spin qubits," Applied Physics Letters 104, 103108, 2014, 4 pages.
Jeffrey, E. et al., "Fast Scalable State Measurement with Superconducting Qubits," arXiv:1401.0257v3 [quant-ph], 17 Jan 2014, 9 pages.
Jerger, M. et al., "Frequency division multiplexing readout and simultaneous manipulation of an array of flux qubits," Applied Physics Letter 101, 042604 (2012), 5 pages.
Jerger, M. et al., "Spectroscopy of a Qubit Array via a Single Transmission Line," arXiv:1102.0404v1 [cond-mat.supr-con], Feb. 2, 2011, 3 pages.
Johnson, M. W. et al., "A scalable control system for a superconducting adiabatic quantum optimization processor," arXiv:0907.3757v2 [quant-ph], Mar. 24, 2010, 14 pages.
Majer, J. et al., "Coupling Superconducting Qubits via a Cavity Bus," arXiv:0709.2135v1 [cond-mat.mes-hall], Sep. 13, 2007, 6 pages.
Manzin, B. et al. "Digital readouts for large microwave low-temperature detector arrays," Nuclear Instruments and Methods in Physics Research, Section A, 2006, 3 pages.
McClure, D. T. et al., "Rapid Driven Reset of a Qubit Readout Resonator," arXiv:1503.01456v1 [quant-ph], Mar. 4, 2015, 5 pages.
Michotte, S., "Qubit dispersive readout scheme with a microstrip squid amplifier," arXiv:0812.0220v1 [cond-mat.supr-con], Dec. 1, 2008, 4 pages.
Monfardini, A. et al., "Nika: A millimeter-wave kinetic inductance camera," Astronomy & Astrophysics, 521, A29 2010, 6 pages.
Palacios-Laloy, A. et al., "Tunable resonators for quantum circuits," arXiv:0712.0221v1 [quant-ph] Dec. 3, 2007, 8 pages.
Palacios-Laloy, A. et al., "Tunable Resonators for Quantum Circuits," J Low Temp Phys (2008) 151: 1034-1042.
Petersan, P. et al., "Measurement of resonant frequency and quality factor of microwave resonators: Comparison of methods," Journal of Applied Physics, vol. 84, No. 6, Sep. 15, 1998, 11 pages.
Robertson, T. L. et al., "Superconducting quantum interference device with frequency-dependent damping: Readout of flux qubits,"Physical Review B 72, 024513 (2005), 9 pages.
Swenson, L. J. et al., "Operation of a titanium nitride superconducting microresonator detector in the nonlinear regime," arXiv:1305.4281v1 [cond-mat.supr-con], May 18, 2013, 11 pages.
Swenson, L.J. et al., "Mako: A pathfinder instrument for on-sky demonstration of low-cost 350 micron imaging arrays," arXiv:1211.0315v1 [astro-ph.IM] Nov. 1, 2012, 10 pages.
Wang, Z. L et al., "Quantum state characterization of a fast tunable superconducting resonator," Applied Physics Letters 102, 163503 (2013), 4 pages.
Yates, S. J. C. et al., "Faster Fourier transform spectrometer readout for large arrays of microwave kinetic inductance detectors," University of Groningen, Applied Physics Letters, 2009, 5 pages.

* cited by examiner

FREQUENCY MULTIPLEXED RESONATOR INPUT AND/OR OUTPUT FOR A SUPERCONDUCTING DEVICE

BACKGROUND

Technical Field

This disclosure generally relates to input and/or output systems and methods for superconducting devices such as superconducting quantum computers and superconducting classical computers, and, more specifically, to systems and methods for inputting data to a superconducting quantum processor and/or measuring the state of a qubit in the superconducting quantum processor.

Frequency Multiplexed Resonant (FMR) Readout

Superconducting microwave resonators have been used in a variety of fields including, but not limited to, quantum computation and astronomy. For example, in quantum computation, superconducting resonators have been used to detect the state of qubits. In astronomy, superconducting microwave resonators have been used in Microwave Kinetic Inductance Detectors (MKIDs). In both cases, many resonators (detectors) can be coupled to a common transmission line and integrated through frequency domain multiplexing. Frequency domain multiplexing (FDM) is a technique in which a communication bandwidth is divided into a number of non-overlapping sub-bands, each sub-band used to carry a separate signal.

Using FMR technology, superconducting resonators of different resonant frequencies can be used for readout of multiple qubits. The resonators can share a common microwave transmission line by using frequency domain multiplexing.

BRIEF SUMMARY

Frequency Multiplexed Resonator (FMR) technology can be used to readout many single flux quanta simultaneously and has applications in both superconducting quantum computing and superconducting classical computing. FMR technology also has applications in inputting data to a superconducting quantum processor, for example via a Quantum Flux Parametron (QFP) device.

In quantum computing, it is desirable to be able to measure the state of a qubit, and it is also desirable that the readout technology is scalable to large numbers of qubits. Similarly, it is desirable for the technology for inputting data to the superconducting quantum processor to be scalable. Scalability The data rate of a non-dissipative readout (NDRO) in a superconducting processor (such as the NDRO described in U.S. Pat. No. 8,169,231) is constant regardless of the processor size. Consequently, the approach does not scale to large processor sizes, for example, a quantum processor having a large number of qubits or a classical superconducting processor having a large number of devices.

Though the data rate can be increased by adding more NDRO lines and associated hardware, the approach is not scalable to large numbers of qubits.

Additional NDRO lines increase the thermal load on the fridge, raising its base temperature. The increased power driven on-chip can increase the chip's heat load. Since performance of the processor can depend on low chip temperature, there can be a trade-off between processor performance and readout speed. Furthermore, adding more lines increases the cost of the hardware.

The performance of a superconducting quantum processor can be limited by the number and bandwidth of input lines. For example, in some existing implementations, the superconducting quantum processor can be accessed via approximately 200 lines each having a bandwidth of 30 MHz. The number and bandwidth of the input lines can, at least in part, determine the rate at which the system can encode new problems on the quantum processor.

Increasing the number and bandwidth of lines is not a scalable approach. Adding more lines can create a number of demands on the system including the need for a larger sample space, and the need for more contact pads on the periphery of the processor chip. Increasing the number of lines can also increase the thermal load on the processor. Moreover, an increase in the number of lines can open up more pathways for non-thermal photons.

Accordingly, there is a desire for input/output technologies which increase the rate at which data can be transmitted (or input) to the chip and received (or readout) from superconducting devices.

The present disclosure describes input/output systems and methods that are able to tune frequency and sensitivity (the change in resonant frequency per unit flux bias of the DC SQUID) independently, and consequently able to use the available bandwidth more efficiently than would typically be feasible without independent sensitivity control.

The present disclosure describes input/output systems and methods that are able to scale to large processor sizes, and provide improved performance, by increasing the rate at which data can be input and/or output to the processor without increasing the number of input/output lines to the processor.

A superconducting readout system may be summarized as including: a microwave transmission line; at least one microwave superconducting resonator communicatively coupled to the microwave transmission line, each microwave superconducting resonator respectively including: a capacitance coupled between the microwave transmission line and a first node via a superconductive path; an inductance coupled between the microwave transmission line and the first node via a superconductive path, the inductance in parallel with the capacitance of the respective microwave superconducting resonator; a first DC superconducting quantum interference device (SQUID) coupled between the inductance and the first node via a superconductive path, in parallel with the capacitance of the respective microwave superconducting resonator and in series with the inductance of the respective microwave superconducting resonator; and a second DC superconducting quantum interference device (SQUID) coupled between the first DC SQUID and the first node via a superconductive path, in parallel with the capacitance of the respective microwave superconducting resonator and in series with the inductance of the respective microwave superconducting resonator and in series with the first DC SQUID of the respective microwave superconducting resonator; a first interface inductively coupled to the first DC SQUID and selectively operable to apply a first flux bias to the first DC SQUID; and a second interface inductively coupled to the second DC SQUID and selectively operable to apply a second flux bias to the second DC SQUID; wherein the second DC SQUID is communicatively coupled to a Quantum Flux Parametron (QFP).

The second DC SQUID may be inductively coupled to the QFP. The QFP may be a shift register and the second DC SQUID may be communicatively coupled to an endpoint of the shift register, the shift register comprising a plurality of stages. The at least one microwave superconducting resonator may include a plurality of microwave superconducting resonators, each of the plurality of microwave superconducting resonators communicatively coupled to the microwave transmission line. The superconducting readout system may be a frequency multiplex resonant readout system. The superconducting readout system may further include: a digital electronics subsystem that generates and detects a baseband signal, the digital electronics subsystem comprising: a Field Programmable Gate Array (FPGA); at least one Digital-to-Analog Converter (DAC) communicatively coupled to an output of the FPGA; and at least one Analog-to-Digital Converter (ADC) communicatively coupled to an input of the FPGA. The superconducting readout system may further include: a microwave subsystem that generates and receives a microwave signal, the microwave subsystem comprising: a pair of complex mixers, a first one of the complex mixers communicatively coupled to the at least one DAC and a second one of the complex mixers communicatively coupled to the at least one ADC; a reference microwave signal generator communicatively coupled to provide a reference microwave signal to at least one of the complex mixers; a programmable attenuator communicatively coupled to the complex mixers; and a microwave switch operable to control passage of the signals between the first one of the complex mixers and the programmable attenuator; and at least one amplifier communicatively coupled to receive a signal from the programmable attenuator. The first flux bias applied by the first interface may tune the resonant frequency of the first microwave resonator, and the second flux bias applied by the second interface may tune the sensitivity of the first microwave resonator. The capacitance may include a parallel plate capacitor. The inductance may include a spiral inductor.

A method for frequency multiplexed resonant readout of a superconducting device may be summarized as including: tuning the resonant frequency of a superconducting resonator by applying a first flux bias to a first DC superconducting quantum interference device (SQUID); and tuning the sensitivity of the superconducting resonator by applying a second bias to a second DC superconducting quantum interference device (SQUID).

The method may further include: stimulating an interaction of the superconducting resonator with a Quantum Flux Parametron (QFP) at a nominal resonant frequency; and detecting a shifted resonant frequency of the superconducting resonator resulting from the interaction of the superconducting resonator with the QFP, wherein the shifted resonant frequency is indicative of a state of the QFP. The frequency multiplexed resonant readout may include a plurality of non-overlapping sub-bands, a first of the plurality of sub-bands allocated to the superconducting resonator; and the tuning of the resonant frequency of the superconducting resonator and the tuning of the sensitivity of the superconducting resonator may cause the nominal resonant frequency of the superconducting resonator and the shifted resonant frequency of the superconducting resonator to lie within the first of the plurality of sub-bands.

A method of fabricating a superconducting parallel plate capacitor may be summarized as including: depositing a first superconductive layer, the first superconductive layer comprising a material that is superconductive in a range of critical temperatures; depositing a first dielectric layer to overlie at least part of the first superconductive layer; depositing a second superconductive layer to overlie at least part of the dielectric layer, the second superconductive layer comprising a material that is superconductive in the range of critical temperatures; removing a portion of the second superconductive layer to form at least one structure from the second superconductive layer and to expose at least part of the first dielectric layer; depositing a second dielectric layer to overlie at least part of the second superconductive layer and at least part of the first dielectric layer; planarizing the second dielectric layer; removing at least part of the second dielectric layer to form a first via exposing at least part of the second superconductive layer; removing at least part of the second dielectric layer and at least part of the first dielectric layer to form a second via exposing at least part of the first superconductive layer; depositing a first region of a third superconductive layer; and depositing a second region of the third superconductive layer, wherein the first region of the third superconductive layer is electrically isolated from the second region of the third superconductive layer, the first region of the third superconductive layer is superconductingly connected to at least part of the second superconductive layer by way of the first via, and the second region of the third superconductive layer is superconductingly connected to at least part of the first superconductive layer by way of the second via.

The first and the second superconductive layers may include niobium. The first dielectric layer may include silicon nitride. The second dielectric layer comprises silicon dioxide. The third superconductive layer comprises niobium. The thickness of the first and the second superconductive layers may be in the range of about 100 nm to 400 nm, the thickness of the first dielectric layer may be in the range of about 10 nm to 100 nm, and the thickness of the second dielectric layer may be in the range of about 100 nm to 300 nm.

A superconducting input/output system may be summarized as including a microwave transmission line; at least one microwave superconducting resonator communicatively coupled to the microwave transmission line, each microwave superconducting resonator respectively comprising: a capacitance coupled between the microwave transmission line and a first node via a superconductive path; an inductance coupled between the microwave transmission line and the first node via a superconductive path, the inductance in parallel with the capacitance of the respective microwave superconducting resonator; a first DC superconducting quantum interference device (SQUID) coupled between the inductance and the first node via a superconductive path, in parallel with the capacitance of the respective microwave superconducting resonator and in series with the inductance of the respective microwave superconducting resonator; and a second DC superconducting quantum interference device (SQUID) coupled between the first DC SQUID and the first node via a superconductive path, in parallel with the capacitance of the respective microwave superconducting resonator and in series with the inductance of the respective microwave superconducting resonator and in series with the first DC SQUID of the respective microwave superconducting resonator; a first interface inductively coupled to the first DC SQUID and selectively operable to apply a first flux bias to the first DC SQUID; and a second interface inductively coupled to the second DC SQUID and selectively operable to apply a second flux bias to the second DC SQUID, wherein the second DC SQUID is communicatively coupled to a Quantum Flux Parametron (QFP); and a third interface inductively coupled to the QFP and selectively operable to apply a third flux bias to the QFP. The second DC SQUID may be inductively coupled to the QFP. The QFP may be a shift register and the second DC SQUID may be communicatively coupled to an endpoint of the shift register, the shift register including a plurality of stages. The at least one microwave superconducting resonator may include a plurality of microwave superconducting resonators, each of the plurality of microwave superconducting resonators communicatively coupled to the microwave transmission line. The superconducting input/output system may be a frequency multiplexed resonator transceiver selectively operable to readout data from the QFP and load data into the QFP.

The superconducting input/output system may further include a microwave subsystem operable to generate a microwave signal for transmission on the microwave transmission line, and operable to receive a microwave signal via the microwave transmission line, the microwave subsystem comprising: a pair of complex mixers, a first one of the complex mixers communicatively coupled to the at least one DAC and a second one of the complex mixers communicatively coupled to the at least one ADC; a reference microwave signal generator communicatively coupled to provide a reference microwave signal to at least one of the complex mixers; a programmable attenuator communicatively coupled to the complex mixers; and a microwave switch operable to control passage of the signals between the first one of the complex mixers and the programmable attenuator; and at least one amplifier communicatively coupled to receive a signal from the programmable attenuator.

The superconducting input/output system may further include a digital electronics subsystem operable to generate a baseband signal for input to the microwave subsystem, and operable to detect a baseband signal received from the microwave subsystem, the digital electronics subsystem including a Field Programmable Gate Array (FPGA); at least one Digital-to-Analog Converter (DAC) communicatively coupled to an output of the FPGA; and at least one Analog-to-Digital Converter (ADC) communicatively coupled to an input of the FPGA. The first flux bias applied by the first interface may tune the resonant frequency of the first microwave resonator, and the second flux bias applied by the second interface may tune the sensitivity of the first microwave resonator. The third flux bias applied by the third interface may cause partial annealing. Partial annealing may include lowering the potential barrier between two stable energy states of the QFP. The capacitance may include a parallel plate capacitor. The inductance may include a spiral inductor. The superconducting input/output system may be a superconducting readout system operable to read out the states of one or more superconducting devices. At least one of the one or more superconducting devices may be a superconducting qubit. The superconducting input/output system may be a superconducting data input system operable to load data into one or more superconducting devices. At least one of the one or more superconducting devices may be a DAC. The QFP may be a final stage of a shift register. The shift register may be communicatively coupled to a DAC.

A method for frequency multiplexed transmission of a data to a superconducting device, the data including a sequence of bits, the superconducting device communicatively coupled to a superconducting resonator, wherein the method may be summarized as including initializing the superconducting device to a first state; applying a flux bias to the superconducting device via a first flux bias line to generate a preference for a second state; lowering a potential barrier in the superconducting device via a second flux bias line; determining whether a first bit in the sequence of bits is represented by a second state; upon determining the first bit is represented by the second state, sending a tone via a microwave transmission line to the superconducting resonator; raising the potential barrier in the superconducting device via the second flux bias line. Initializing the superconducting device may include initializing a QFP. Initializing the QFP may include initializing a last stage of a shift register communicatively coupled to a DAC.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not necessarily drawn to scale, and some of these elements are arbitrarily enlarged and positioned to improve drawing legibility.

Further, the particular shapes of the elements as drawn, are not necessarily intended to convey any information regarding the actual shape of the particular elements, and have been solely selected for ease of recognition in the drawings.

DETAILED DESCRIPTION

Preamble

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with superconductive circuits or resonators have not been shown or described in detail to avoid unnecessarily obscuring descriptions of the embodiments of the present methods. Throughout this specification and the appended claims, the words "element" and "elements" are used to encompass, but are not limited to, all such structures, systems, and devices associated with superconductive circuits and resonators.

Unless the context requires otherwise, throughout the specification and claims which follow, the word "comprise" is synonymous with "including," and is inclusive or open-ended (i.e., does not exclude additional, unrecited elements or acts).

Reference throughout this specification to "one embodiment" "an embodiment", "another embodiment", "one example", "an example", "another example", "one implementation", "another implementation", or the like means that a particular referent feature, structure, or characteristic described in connection with the embodiment, example, or implementation is included in at least one embodiment, example, or implementation. Thus, the appearances of the phrases "in one embodiment", "in an embodiment", "another embodiment" or the like in various places throughout this specification are not necessarily all referring to the same embodiment, example, or implementation. Furthermore, the particular features, structures, or characteristics may be combined in any suitable manner in one or more embodiments, examples, or implementations.

It should be noted that, as used in this specification and the appended claims, the singular forms "a," "an," and "the" include plural referents unless the content clearly dictates otherwise. Thus, for example, reference to a readout system including "a superconducting resonator" includes a single superconducting resonator, or two or more superconducting resonators. It should also be noted that the term "or" is generally employed in its sense including "and/or" unless the content clearly dictates otherwise.

The headings provided herein are for convenience only and do not interpret the scope or meaning of the embodiments.

Single SQUID Superconducting Resonator

Figure 1A:
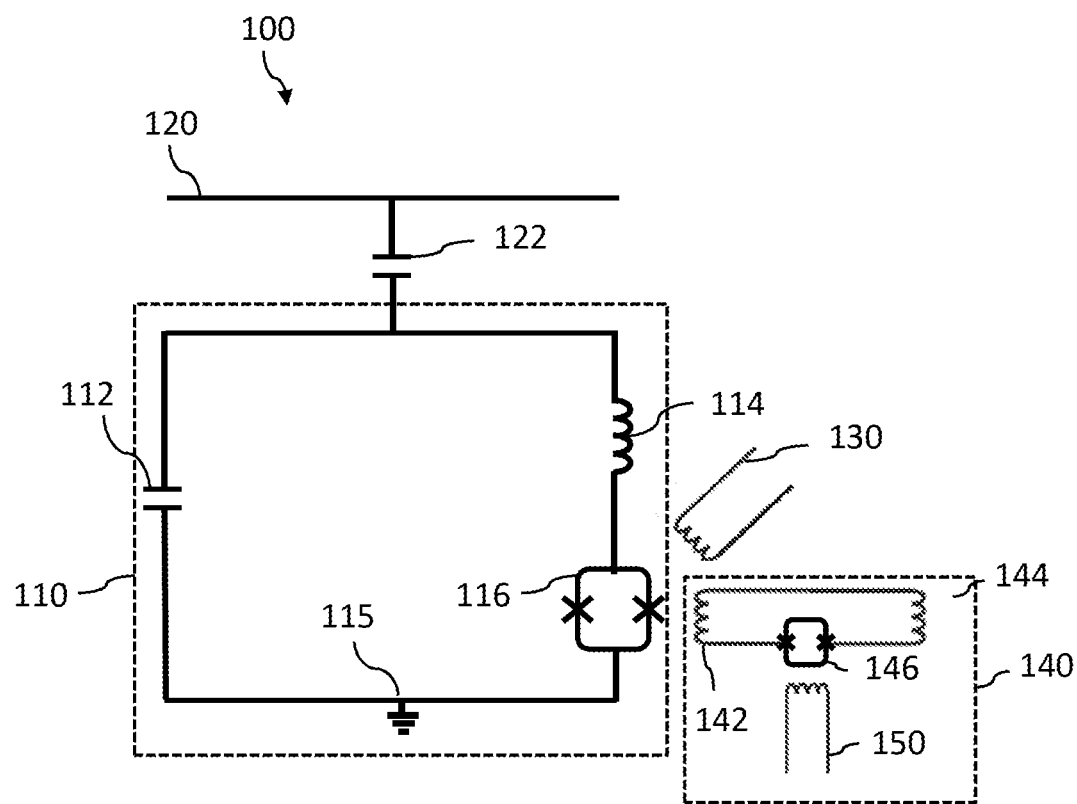
FIG. 1A is a schematic diagram illustrating an example embodiment of a superconducting circuit comprising a superconducting resonator able to tune a resonator frequency.

FIG. 1A shows a superconducting circuit 100 comprising a superconducting resonator 110 according to at least a first exemplary implementation. Superconducting resonator 110 comprises a capacitance 112, and an inductance 114, which may or may not take the form of discrete capacitors and inductors, respectively.

Superconducting resonator 110 further comprises a single SQUID loop 116. SQUID loop 116 is a DC SQUID and comprises a pair of Josephson junctions in parallel with one another in a superconducting loop. SQUID loop 116 enables tuning of the resonance frequency of superconducting resonator 110 by adjusting the SQUID flux bias as explained below.

The resonance frequency $\omega$ of superconducting resonator 110 can be determined by the following formula for an LC circuit:

$$\omega = \frac{1}{\sqrt{(LC)}}$$

where C is the value of capacitance 112 and L is the sum of the geometric inductance 114 and the parallel sum of the Josephson inductances from the two Josephson junctions in SQUID loop 116.

Small fluctuations in capacitance C and/or inductance L result in a fractional frequency perturbation of the resonance frequency as follows:

$$\frac{\delta\omega}{\omega} = \frac{-\delta C}{2C} + \frac{-\delta L}{2L}$$

In one implementation, superconducting resonator 110 is a distributed resonator. A distributed resonator has capacitance and inductance that cannot be isolated into separate lumped element capacitors and inductors. An advantage of a distributed resonator is that it can be designed to be insensitive to layer thickness. A distributed resonator can also be more tolerant to variations in fabrication. A distributed resonator can exhibit harmonics at every octave which can be a disadvantage in an implementation using more than one octave of bandwidth.

In other implementations, superconducting resonator 110 is a lumped element design. A lumped element design can advantageously provide a bandwidth greater than one octave, and can reduce or minimize the extent of the resonator's electric field. Since the loss tangent of superconducting resonator 110 can depend on the volume of lossy dielectric exposed to the resonator's electric field, it can be beneficial to use a lumped element design.

In a lumped element design, capacitance 112 can be implemented using one or more capacitors. The capacitors can be interdigitated capacitors and/or parallel plate capacitors. In one implementation, capacitance 112 is implemented using a parallel plate capacitor. In one example, the capacitance of the parallel plate capacitor is approximately 2 pF.

The capacitance C of a parallel plate capacitor is given by:

$$C = \frac{\epsilon A}{d}$$

where $\epsilon$ is the permittivity of the dielectric separating the plates, A is the area of one of the plates and d is the thickness of the dielectric.

In practice, area A may be defined by lithography, and fractional errors in area A are expected to be small relative to other errors. The thickness of the dielectric can vary and can contribute significantly to variations in capacitance C and in the resonance frequency ω of a resonator comprising capacitance C. The dependence on variations in dielectric thickness is as follows:

$$\frac{\delta \omega}{\omega} = \frac{\delta d}{2d}$$

In a lumped element design, inductance 114 can be implemented using one or more inductors. In one implementation, inductance 114 is implemented using a niobium spiral inductor. In one example, the geometric inductance of the spiral inductor is approximately 1 nH. In another implementation, inductance 114 is implemented using a spiral inductor comprising a high kinetic inductance material such as TiN or WSi.

Energy stored in the inertia of the superconducting pairs can contribute a kinetic inductance. The total inductance in superconducting resonator 110 is a sum of the geometric inductance, the kinetic inductance, and the inductance of SQUID loop 116.

Circuit 100 further comprises a transmission line 120, a coupling capacitance 122, and a last or final shift register stage 140. Last shift register stage 140 comprises inductances 142 and 144, SQUID loop 146 and interface 150. Last or final shift register stage 140 may, for example, take the form of a Quantum Flux Parametron (QFP). Last or final shift register stage 140 is the endpoint of a shift register comprising one or more stages. Last or final shift register stage 140 is a stage that can be communicatively coupled to superconducting resonator 110 for the purposes of reading out the state of a superconducting device. In one implementation, superconducting resonator 110 is fed by a flux shift register which, in turn, is fed by a flux qubit.

The quantum flux parametron (QFP) is a superconducting Josephson junction device similar in structure to a compound rf-SQUID. The name "quantum flux parametron", however, encompasses both the operation and the structure of the Josephson junction device, not simply structure alone.

Interface 130 can provide a flux bias to SQUID loop 116 and can be controlled by a flux DAC (not shown in FIG. 1A) or by an analog line. Using a flux DAC reduces the number of low-frequency analog control lines to the superconducting circuit.

A flux DAC is an example of an on-chip control circuitry. Further examples can be found in U.S. Pat. Nos. 7,876,248; 7,843,209; 8,018,244; 8,098,179; 8,169,231; and 8,786,476.

Superconducting resonator 110 can be coupled to transmission line 120 via coupling capacitance 122 (e.g., a discrete capacitor). Transmission line 120 can optionally be coupled to one or more other superconducting resonators (not shown in FIG. 1A).

Superconducting resonator 110 is connected at node 115 to ground.

Superconducting resonator 110 comprising single SQUID loop 116 does not enable independent tuning of the resonance frequency and the sensitivity of superconducting resonator 110.

Figure 1B:
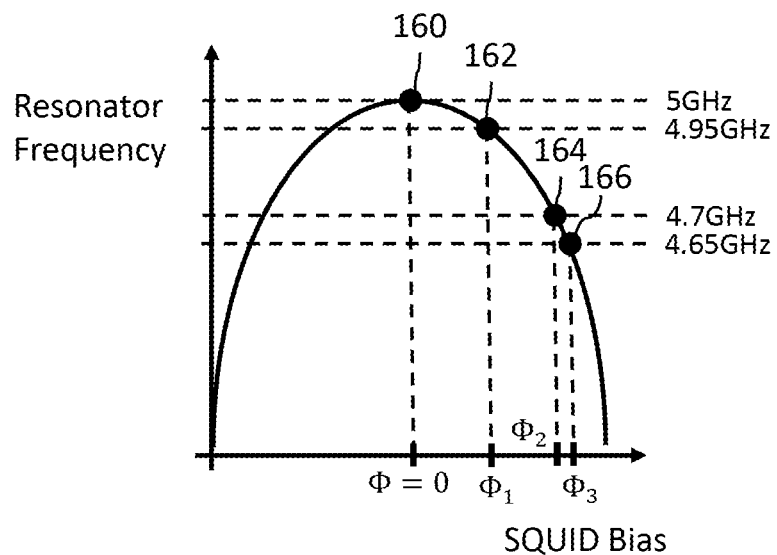
FIG. 1B is an example graph illustrating the use of SQUID flux bias to tune the resonator frequency.

FIG. 1B is an example graph illustrating the variation of resonator frequency with SQUID flux bias. The SQUID flux bias can be used to tune the resonator frequency. In the example shown in FIG. 1B, the resonator frequency is 5 GHz at zero flux bias, corresponding to point 160 on the graph. Increasing the flux bias tunes the resonator down in frequency. In the example shown in FIG. 1B, the resonator can be tuned down by 50 MHz to a frequency of 4.95 GHz by increasing the flux from zero to $\Phi_1$, the result indicated by point 162 on the graph.

The sensitivity is proportional to the slope of the graph shown in FIG. 1B. Hence, a smaller increase in flux bias will cause the same frequency shift at lower frequencies. This is illustrated by points 164 and 166 on the graph shown in FIG. 1B. An increase in flux bias from $\Phi_2$ to $\Phi_3$ causes the resonator frequency to shift 50 MHz from 4.7 GHz to 4.65 GHz. The difference between $\Phi_3$ and $\Phi_2$ is less than between $\Phi_1$ and $\Phi=0$.

As mentioned previously, the sensitivity is not independently tunable and can vary significantly with flux bias. This can result in an undesirable tuning-dependent frequency shift for the same flux modulation from the last or final shift register stage coupled to the resonator. It is desirable to have a superconducting resonator in which resonator frequency and sensitivity can be independently adjusted to provide a suitable operating point. For example, independent adjustment of resonant frequency and sensitivity can be used to compensate for frequency shifts arising from variations occurring during fabrication of superconducting circuits such as circuit 100 of FIG. 1A.

Figure 1C:
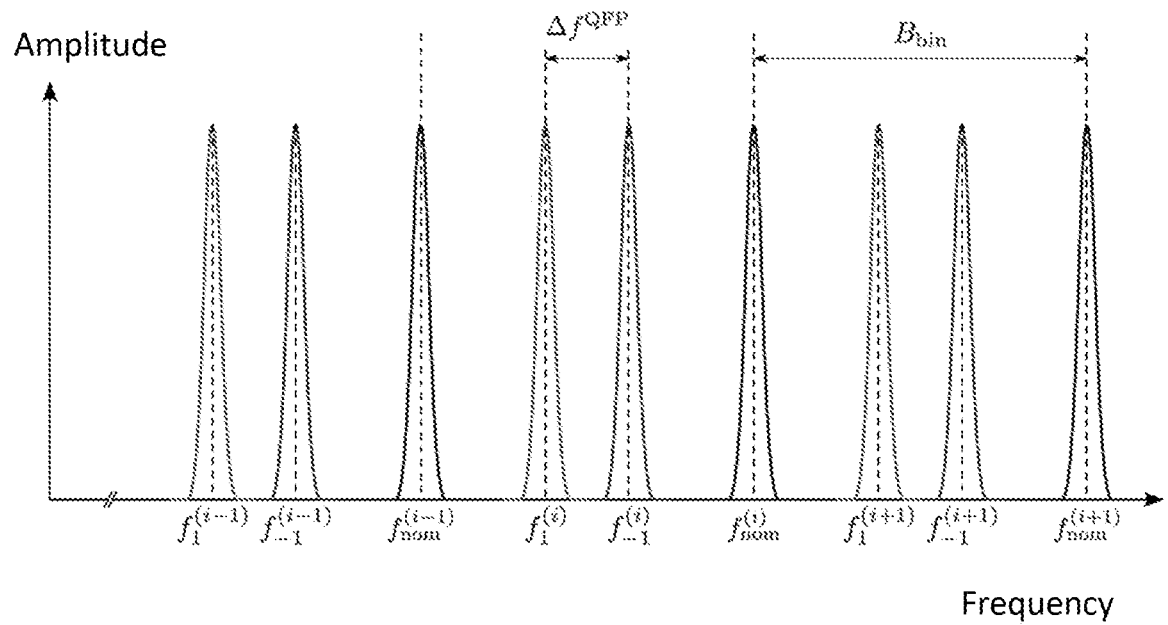
FIG. 1C is a plot illustrating schematically part of a Frequency Multiplexed Resonator (FMR) spectrum.

FIG. 1C is a plot illustrating schematically part of an FMR spectrum. The FMR spectrum is a plot of resonant amplitude versus frequency. The FMR spectrum comprises spectrum from three resonators shown in their various states. Frequency $f_{nom}$ is the resonator frequency when no flux bias is applied to SQUID loop 116 of FIG. 1A. Frequency $f_1$ is the resonator frequency when attached QFP 140 is in a positive latched state. Frequency $f_2$ is the resonator frequency when attached QFP 140 is in a negative latched state. The change in frequency for a given resonance between when attached QFP 140 is in a positive state and a negative state is $\Delta f^{QFP}$. Adjacent resonators are separated by frequency difference $B_{bin}$.

To guard against variations in the performance of the resonators (for example, caused by variations in fabrication), $f_{nom}^{(i)}$ can be selected to lie approximately at the center between $f_{-1}^{(i)}$ and $f_1^{(i+1)}$. Adjacent resonances can be separated by a guard band. In one implementation, adjacent resonators are separated by three times the linewidth of an individual resonance, and $B_{bin}$ is four times $\Delta f^{QFP}$. As explained below, the flux DACs for superconducting circuit 100 (not shown in FIG. 1A) can be used to position the resonances within the bandwidth with sufficient precision.

It may be desirable to achieve a dense packing of the resonances within the bandwidth. This can be achieved by positioning the resonances at regularly spaced frequencies with a determined frequency shift (i.e. sensitivity). Guard bands between resonances can be used to reduce electronic cross-talk between neighboring resonators.

Superconducting Resonator with Two SQUID Loops

Figure 2A:
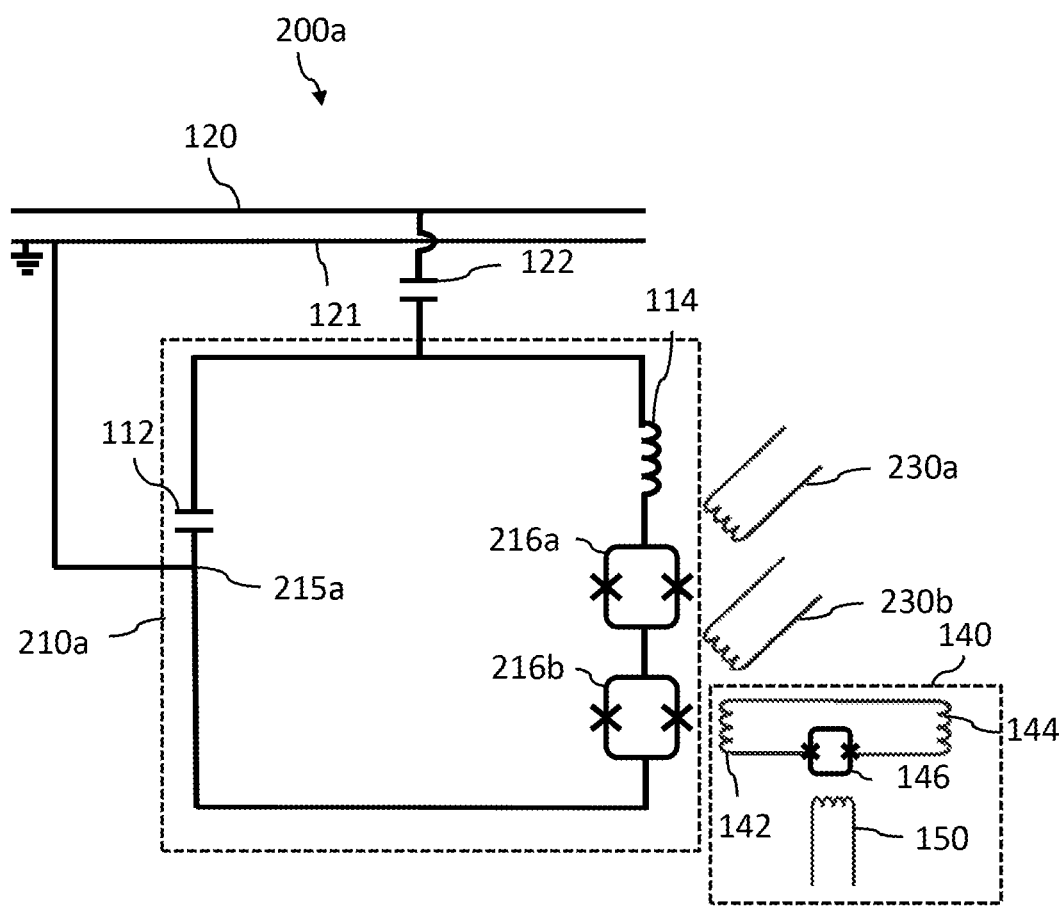
FIG. 2A is a schematic diagram illustrating a first example embodiment of a superconducting circuit comprising a superconducting resonator with two SQUID loops, able to independently tune the resonator frequency and sensitivity.

FIG. 2A shows a superconducting circuit 200a according to at least one implementation, comprising a superconducting resonator 210a with two SQUID loops, able to independently tune the resonator frequency and sensitivity. Superconducting resonator 210a comprises two SQUID loops 216a and 216b. Each of SQUID loops 216a and 216b is a DC SQUID and comprises a pair of Josephson junctions in parallel with one another in a superconducting loop. SQUID loops 216a and 216b advantageously enable independent tuning of the resonance frequency and the sensitivity of superconducting resonator 210a by adjusting the flux bias in SQUID loops 216a and 216b as explained below.

Components of superconducting circuit 200a labeled with the same numbers as in superconducting circuit 100 of FIG. 1A are similar or even identical to those described in reference to FIG. 1A. For example, capacitance 112 of superconducting circuit 200a can be a parallel plate capacitor, and inductance 114 of superconducting circuit 200a can be a niobium spiral inductor. Superconducting resonator 210a is connected at node 215a to ground, for example to the ground 121 of transmission line 120.

Interfaces 230a and 230b can provide flux bias to SQUID loops 216a and 216b respectively. Once a suitable operating point has been found (see below), the flux biases provided by interfaces 230a and 230b can be static. This advantageously allows the circuit to use an array of flux DACs requiring only a few wires to program. The two tunable SQUID loops 216a and 216b do not need an independent analog control line for each superconducting resonator 210a.

Figure 2B:
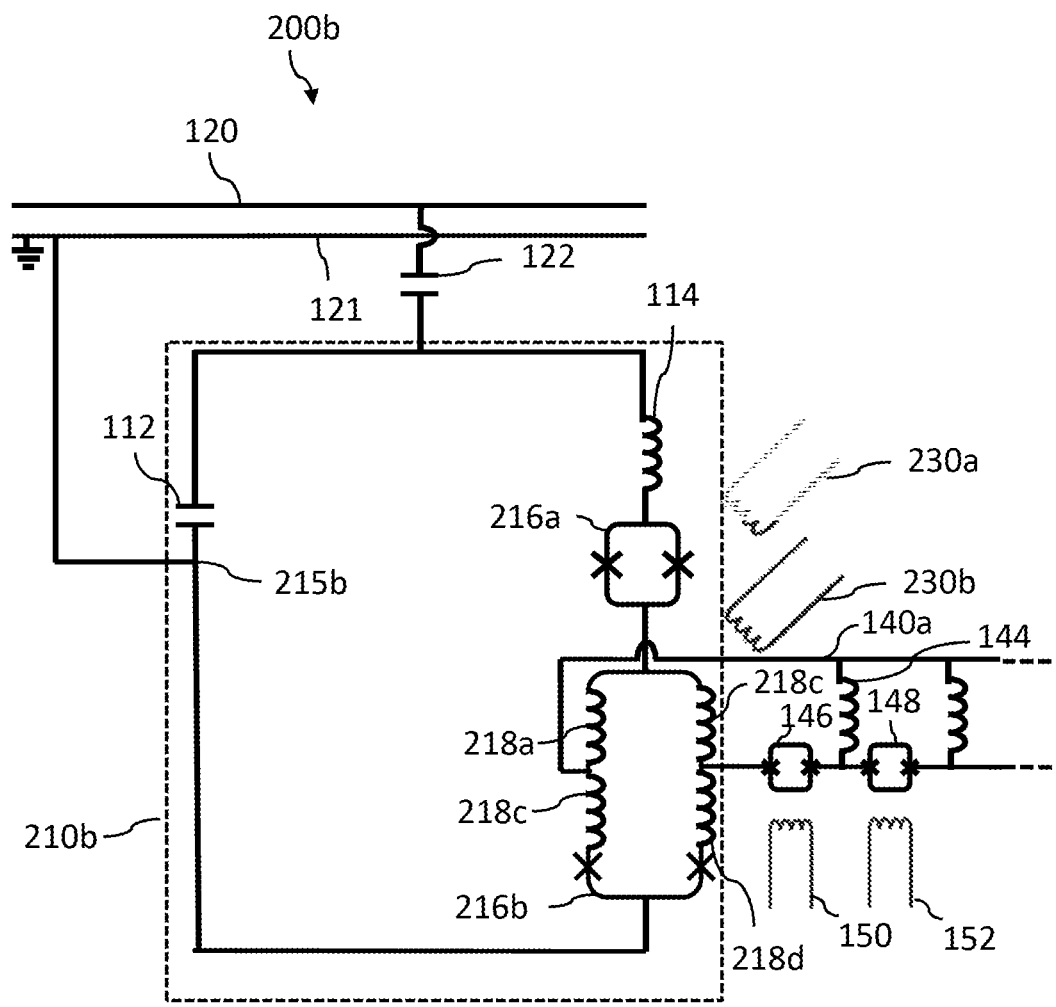
FIG. 2B is a schematic diagram illustrating a second example embodiment of a superconducting circuit comprising a superconducting resonator with two SQUID loops, able to independently tune the resonator frequency and sensitivity.

FIG. 2B shows a superconducting circuit 200b according to at least another implementation, comprising a superconducting resonator 210b with two SQUID loops, advantageously operable to independently tune the resonator frequency and sensitivity. Superconducting resonator 210b comprises two SQUID loops 216a and 216b. Each of SQUID loops 216a and 216b is a DC SQUID and comprises a pair of Josephson junctions in parallel in a superconducting loop. SQUID loop 216b further comprises inductances 218a through 218d. SQUID loops 216a and 216b enable independent tuning of the resonance frequency and the sensitivity of superconducting resonator 210a by adjusting the flux bias in SQUID loops 216a and 216b as explained below.

SQUID loop 218b is galvanically coupled to a last or final shift register stage comprising DC SQUID 146 and inductance 144. Interfaces 150 and 152 can provide flux bias to DC SQUIDs 146 and 148 respectively. Superconducting resonator 210b is connected at node 215b to ground, for example to the ground 121 of transmission line 120.

Components of superconducting circuit 200b labeled with the same numbers as in superconducting circuit 100 of FIG. 1A are similar or even identical to those described in reference to FIG. 1A. For example, capacitance 112 of superconducting circuit 200b can be a parallel plate capacitor, and inductance 114 of superconducting circuit 200b can be a niobium spiral inductor.

Interfaces 230a and 230b can provide flux bias to SQUID loops 216a and 216b respectively.

Figure 2C:
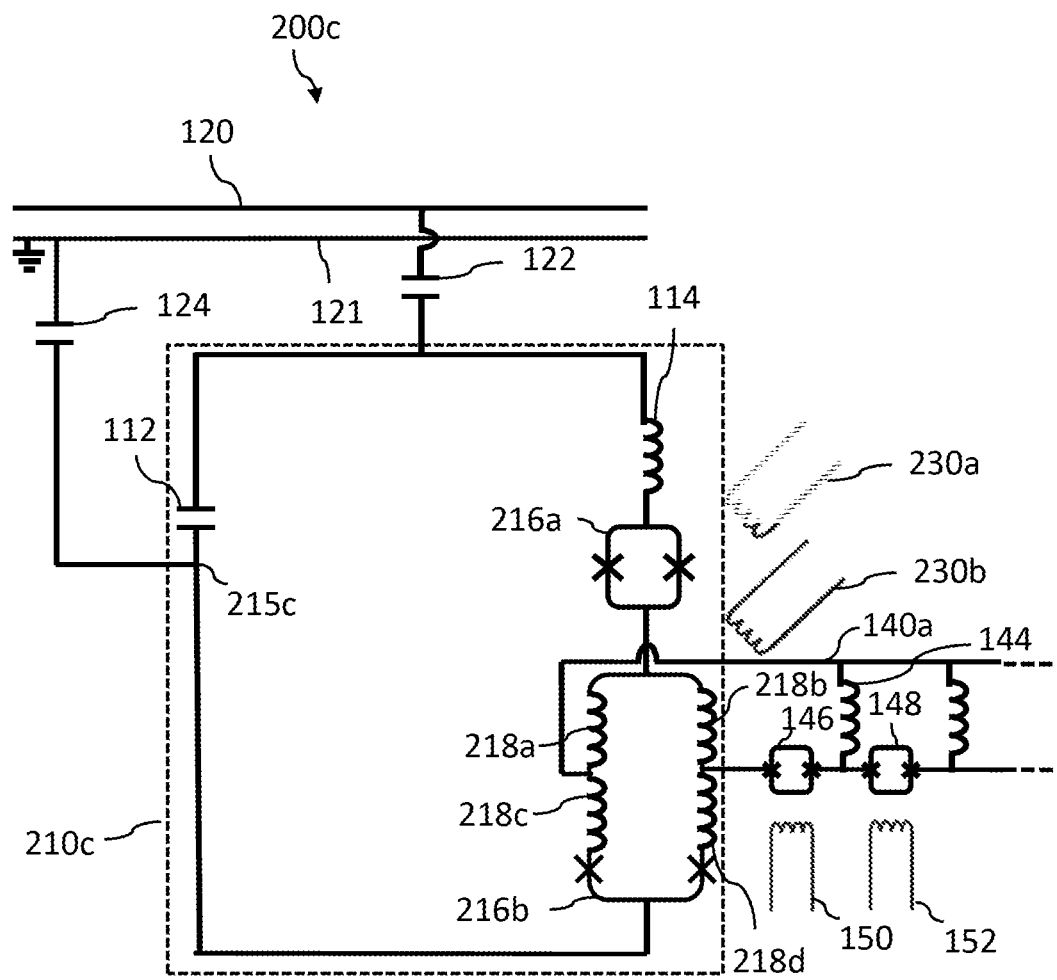
FIG. 2C is a schematic diagram illustrating a third example embodiment of a superconducting circuit comprising a superconducting resonator with two SQUID loops, able to independently tune the resonator frequency and sensitivity.

FIG. 2C shows a superconducting circuit 200c according to at least another implementation, comprising a superconducting resonator 210c with two SQUID loops, advantageously operable to independently tune the resonator frequency and sensitivity. Superconducting circuit 200c is connected at node 215c to the ground 121 of transmission line 120 via a coupling capacitor 124. In other respects, superconducting circuit 200c is the same as or similar to superconducting circuit 200b.

Components of superconducting circuit 200c labeled with the same numbers as in superconducting circuit 100 of FIG. 1A can be as described in reference to FIG. 1A. For example, capacitance 112 of superconducting circuit 200a can be a parallel plate capacitor, and inductance 114 of superconducting circuit 200c can be a niobium spiral inductor.

Independent Tuning of Frequency and Sensitivity Using Two SQUID Loops

As previously discussed, a superconducting resonator comprising a fixed geometric inductance, a capacitance and a single SQUID loop (such as superconducting resonator 110 of FIG. 1A) does not enable independent tuning of resonance frequency and sensitivity. As described above with reference to FIGS. 2A, 2B and 2C, adding a second SQUID loop to the superconducting resonator provides an additional degree of freedom, and enables independent tuning of resonance frequency and sensitivity.

Figure 3:
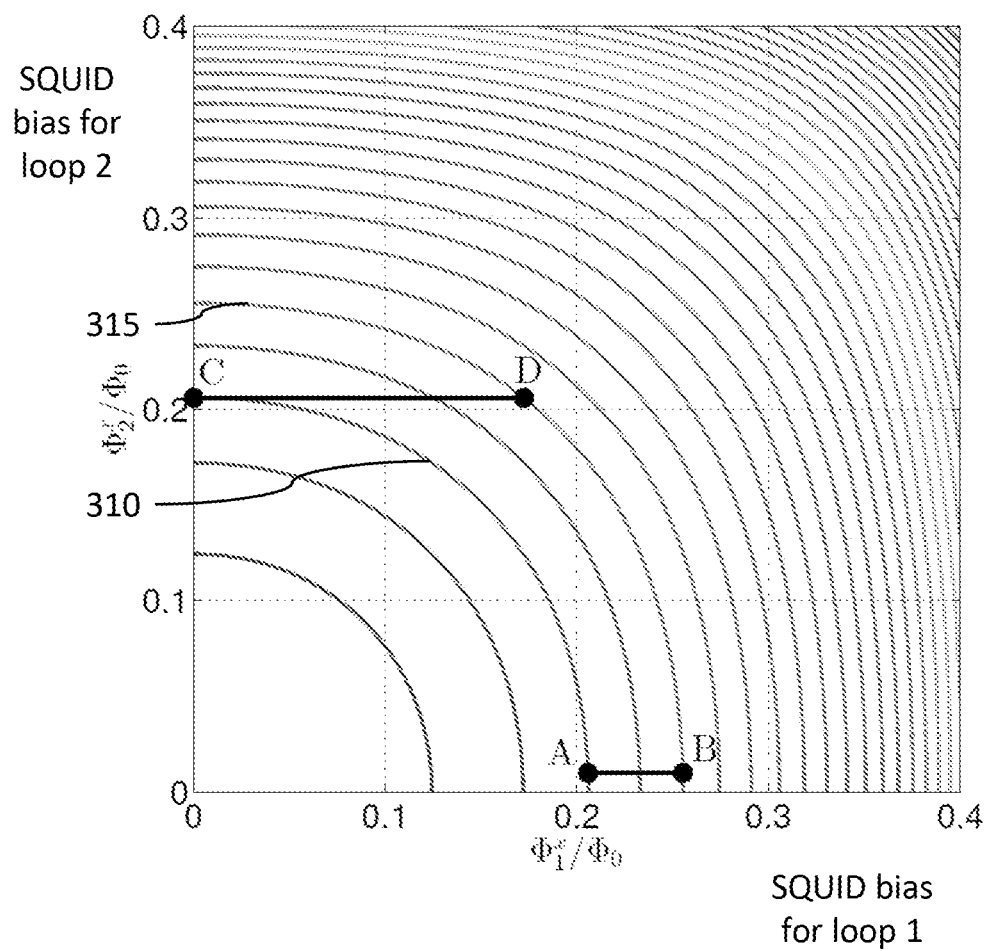
FIG. 3 is a plot of the modulation curve for a superconducting circuit comprising a superconducting resonator with two SQUID loops such as the superconducting circuit of FIG. 2A.

FIG. 3 is a plot of the modulation curve for a superconducting circuit comprising a superconducting resonator with two SQUID loops such as the superconducting circuit of FIG. 2A. Plot 300 shows contours of constant frequency including example contours 310 and 315. Plot 300 includes a first axis denoting the flux bias in a first SQUID loop, and a second axis denoting the flux bias in a second SQUID loop.

In FIG. 3, the frequency at the origin of the plot is 4.932 GHz. Contours 310 and 315 are at 4.926 GHz and 4.922 GHz respectively, separated by 4 MHz. Flux sensitivity can be adjusted by changing location of an operating point of superconducting circuit 200a along a given contour of constant frequency. Since only one of the two SQUID loops 216a and 216b of FIG. 2A is coupled to last or final shift register stage 140, a change in the shift register state results in either a vertical shift or a horizontal shift in plot 300 of FIG. 3. The direction of the shift depends on which SQUID loop (216a or 216b) is coupled to last or final shift register stage 140. In FIG. 2A, SQUID loop 216b is coupled to last or final shift register 140, and the shift will be in the horizontal direction i.e. parallel to the x-axis of plot 300 of FIG. 3.

The change in flux bias required to cause a given frequency shift will depend on the location of the operating point on the contour. For example, a horizontal shift from location A on contour 310 to location B on contour 315 requires a smaller change in flux bias than a shift from location C on contour 310 to location D on contour 315. The frequency shift is the same in both cases. The frequency shift per unit flux bias is known as the sensitivity. The sensitivity is greater when the operating point is at location A on contour 310 than at location C on location 310.

A suitable operating point can be established by the method described in the following paragraphs. The SQUID bias for loop 216a is denoted by $\Phi_a$ and the SQUID bias for loop 216b is denoted by $\Phi_b$.

Firstly, $\Phi_a$ is kept at zero while $\Phi_b$ is increased from zero until a desired operating frequency is found. The shift register is then operated and the frequency shift between the two possible states (i.e., the flux sensitivity) is measured. The process is then repeated while $\Phi_b$ is kept at zero and $\Phi_a$ is increased from zero until the desired operating frequency is achieved. The flux sensitivity is again measured. If a desired flux sensitivity lies between the bounds set by the first two measurements described above, then an iterative approach can be used to find the preferred operating point.

The calibration process to determine the preferred operating point steps through possible values of $\Phi_b$, adjusting $\Phi_a$ to achieve the desired frequency and then measuring sensitivity. In one implementation, a binomial search can be used to determine the preferred values of $\Phi_a$ and $\Phi_b$. In other implementations, other suitable search methods can be used.

Single SQUID Loop with Tunable Coupler

Figure 4:
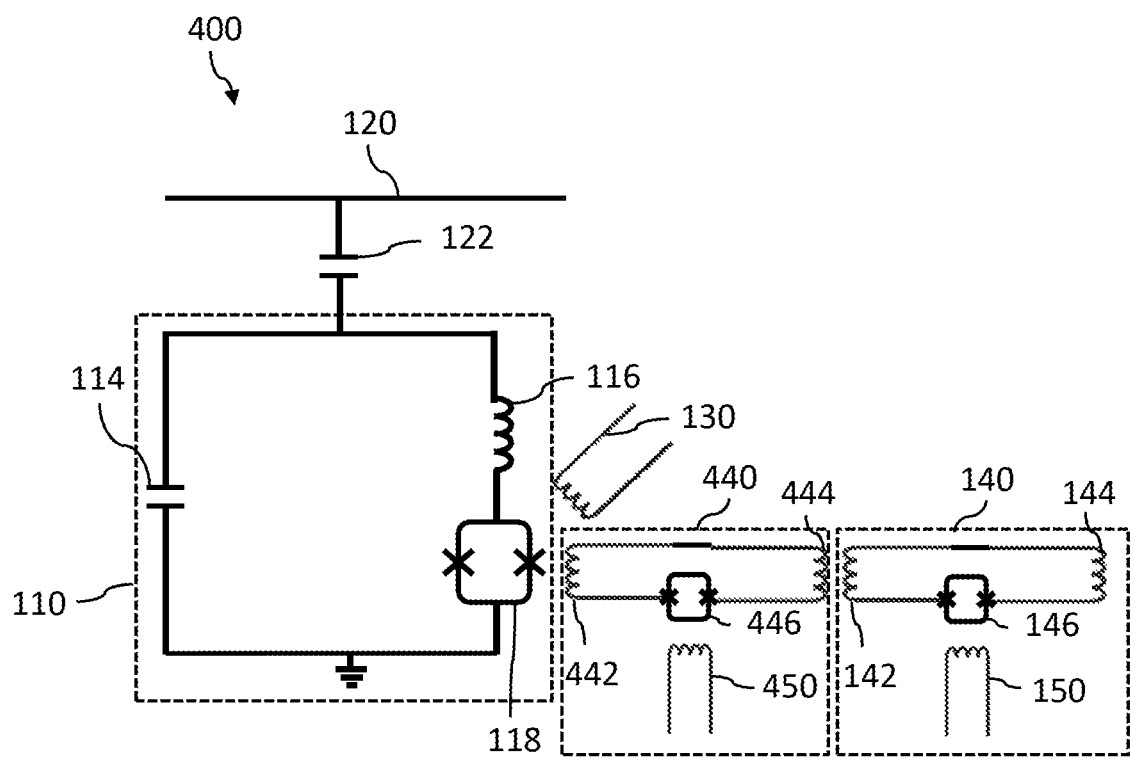
FIG. 4 is a schematic diagram illustrating an example embodiment of a superconducting circuit comprising the superconducting resonator of FIG. 1A and able to independently tune the resonator frequency and sensitivity.

FIG. 4 shows a superconducting circuit 400 according to at least one implementation, comprising superconducting resonator 110 of FIG. 1A and advantageously operable to independently tune the resonator frequency and sensitivity. Superconducting circuit further comprises interface 130 and last or final shift register stage 140, both as described with reference to FIG. 1A.

Superconducting circuit 400 further comprises a tunable coupler 440 in between superconducting resonator 110 and last or final shift register stage (or QFP) 140. Superconducting circuit 400 enables independent tuning of the resonance frequency and the sensitivity to QFP flux, provided the variable loading of superconducting resonator 110 by tunable coupler 440 is taken into account.

Tunable coupler 440 comprises inductances 442 and 444, and DC SQUID 446. Superconducting circuit 400 further comprises interface 450.

Readout System

Figure 5:
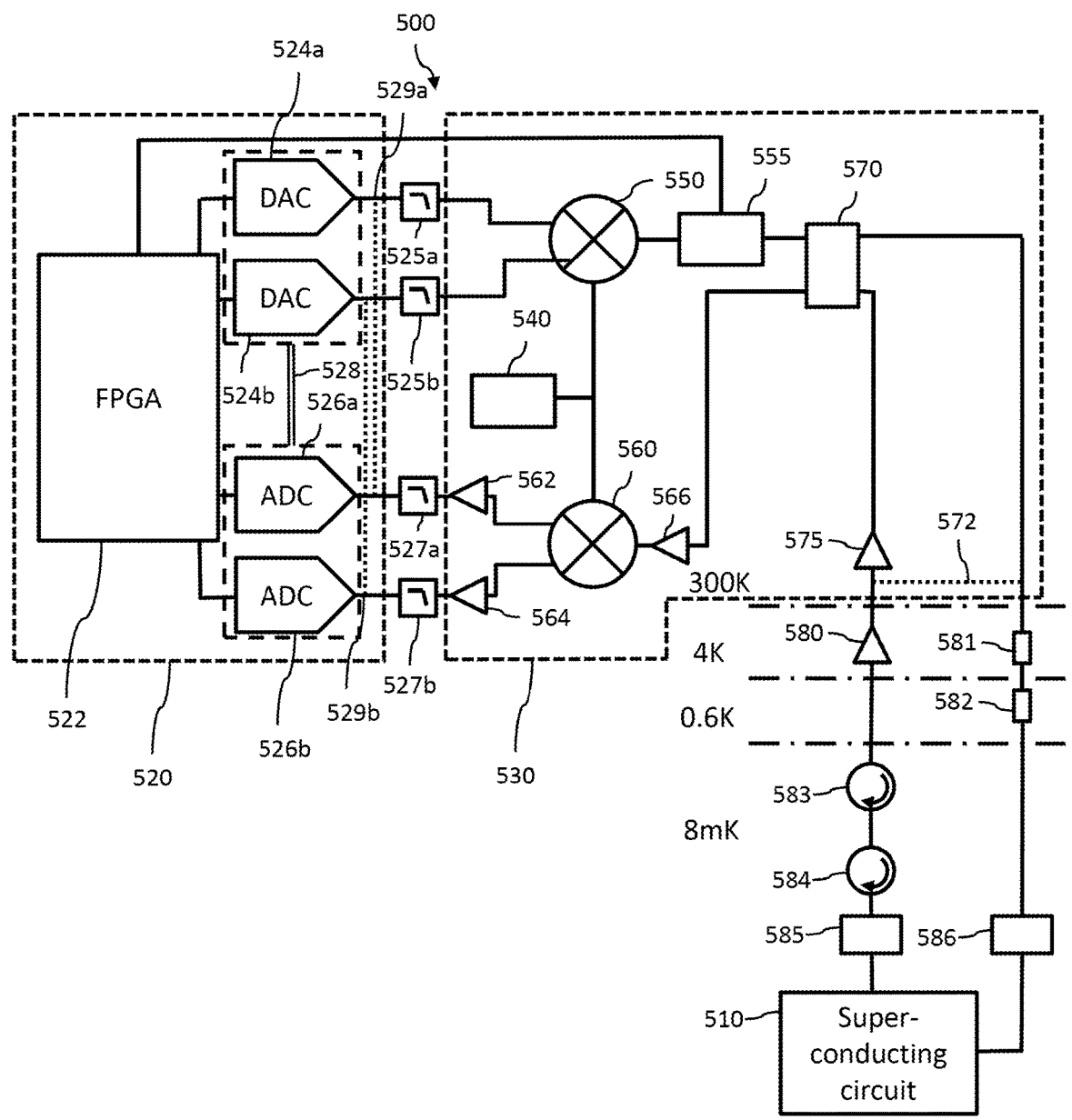
FIG. 5 is a schematic diagram illustrating an example embodiment of a readout system for a superconducting circuit.

FIG. 5 shows a readout system 500 for a superconducting circuit 510 according to at least one exemplary implementation. In the illustrated implementation, superconducting circuit 510 comprises one or more superconducting resonators (not shown in FIG. 5) such as superconducting resonator 210a of FIG. 2A. In the illustrated implementation, superconducting circuit 510 comprises a superconducting quantum processor. In other implementations, superconducting circuit 510 comprises a superconducting classical processor.

Readout system 500 comprises a digital board 520 and a microwave board 530. Digital board 520 comprises a Field Programmable Gate Array (FPGA) 522 (such as a Xilinx Kintex-7 FPGA from Xilinx, Inc. of San Jose, Calif., US), two Digital-to-Analog Converters (DACs) 524a and 524b, and two Analog-to-Digital Converters (ADCs) 526a and 526b. In other embodiments, digital board 520 comprises two FPGAs, one providing output to DACs 524a and 524b, and the other providing output to ADCs 526a and 526b. In one implementation, each of DACs 524a and 524b can be implemented using an Analog Devices 9129 DAC which is a dual-channel 14-bit DAC operating at up to about 5.6 Gsps (Giga samplesper second). ADCs 526a and 526b can be implemented using a multi-channel device such as an E2V EV10AQ190 which is a quad-channel 10-bit ADC capable of operating in dual-channel mode at up to about 2.5 Gsps.

Readout system 500 advantageously enables independent addressing of the two side-bands of the FMR spectrum. The complex received signal is given by:

$$x(n)=I(n)+jQ(n)$$

where I(n) is the output of ADC 526a and Q(n) is the output of ADC 526b.

The FMR spectrum is computed as follows:

$$X_k = \frac{1}{N}\sum_{n=0}^{N-1} x(n)\left[\cos\left(\frac{2\pi kn}{N}\right) - j\sin\left(\frac{2\pi kn + 2\pi k\tau}{N}\right)\right]$$

for $k \in 0,1,2,3 \ldots N-1$. The second term in the argument of the sine function depends on $\tau$ and can be used to compensate for the phase imbalance between the two mixer channels that results from the analog nature of the mixer.

Digital board 520 further comprises two loopback lines 529a and 529b, and a sync/clock connection 528. Loopback line 529a connects the output of DAC 524a to the input of ADC 526a. Loopback line 529b connects the output of DAC 524b to the input of ADC 526b.

Microwave subsystem or microwave board 530 further comprises a loopback line 572. Loopback line 572 connects the input and output to cryogenic subsystem (not shown in FIG. 5) used to cool superconducting device 510 to temperatures as low as a few mK.

Loopback lines 529a and 529b on digital board 520, and loopback line 572 on microwave board 530 are optional, and used when required to bypass other elements of readout system 500.

Readout system 500 further comprises two reconstruction filters 525a and 525b, and two anti-aliasing filters 527a and 527b. Reconstruction filters 525a and 525b are low-pass analog filters that can be used to produce a band-limited analog signal from a digital input. Anti-aliasing filters 527a and 527b are low-pass analog filters that can be used to band-limit a received signal in order to satisfy or approximately satisfy the sampling theorem over a band of interest.

Microwave board 530 comprises a Voltage-Controlled Oscillator (VCO)/Phase Locked Loop (PLL) 540 which provides a reference microwave signal, mixers 550 and 560, and programmable attenuators 570. Microwave board 530 further comprises amplifiers 562, 564, 566 and 575. Amplifiers 562, 564, 566 and 575 can be used to provide level control on the signal received from superconducting circuit 510. In one implementation, amplifier 566 can be a Miteq AFS4-02000800-30-22P-4, and amplifier 575 can be a Miteq AFD3-040080-28-LN low-noise amplifier. These exemplary amplifiers are available from Miteq Inc., of Hauppauge, N.Y., US. Microwave board 530 further comprises a microwave switch 555 controlled by a signal from FPGA 522 on digital board 520.

In one implementation, mixers 550 and 560 are complex mixers.

The illustrated readout system 500 further comprises amplifier 580, attenuators 581 and 582, circulators 583 and 584, and DC blocks 585 and 586. DC blocks 585 and 586 are used as a thermal break on each of the input and output lines to superconducting circuit 510.

In one implementation, amplifier 580 can be a LNF-3611-28-04000800 low-noise cryogenic amplifier. Amplifier 580 and attenuator 581 can operate at 4 K. Attenuator 582 can operate at 0.6 K. Circulators 583 and 584, and DC blocks 585 and 586, can operate at 8 mK. In one implementation, cryogenic circulators 583 and 584 can each be implemented using a Quinstar CTH0408KC, and DC blocks 585 and 586 can each be implemented using an Aeroflex/Inmet 8039.

Using 60 resonators and a bandwidth of 2.5 GHz, a data rate of approximately 600 Mbps can be achieved for a shift register stage (SRS) operation time of 25 ns.

Method of Operation of Readout System

Figure 6:
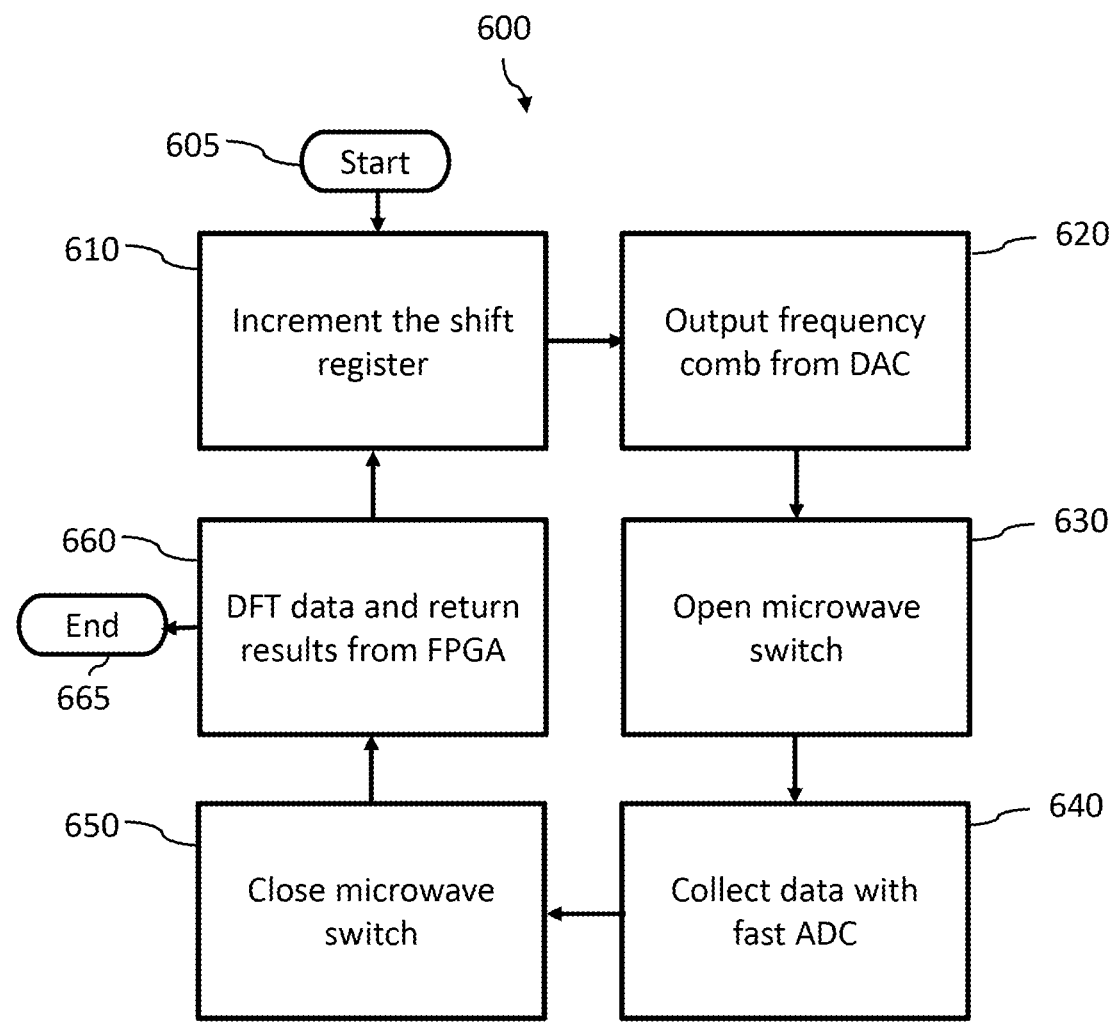
FIG. 6 is a flow chart illustrating a method of operation of the readout system of FIG. 5.

FIG. 6 shows a method 600 of operation of readout system 500 of FIG. 5, according to at least one implementation. Method 600 starts at 605, for example in response to a powering up of readout system 500 or invocation of a routine. At 610, readout system 500 provides a flux signal for readout. In one implementation, readout system 500 increments the shift register (not shown in FIG. 5) at 610. At 620, readout system 500 outputs a frequency comb of DACs 524a and 524b. At 630, readout system 500 opens microwave switch 555. At 640, readout system 500 collects data via ADCs 526a and 526b. At 650, readout system 500 closes microwave switch 555. At 660, FPGA 522 performs a DFT on the data output by ADCs 526a and 526b, and returns the values of the FMR spectrum. Method 600 loops through 610 to 660 until the readout is complete, and then ends at 665 until invoked again.

FMR Technology for Superconducting Qubits

Figure 7:
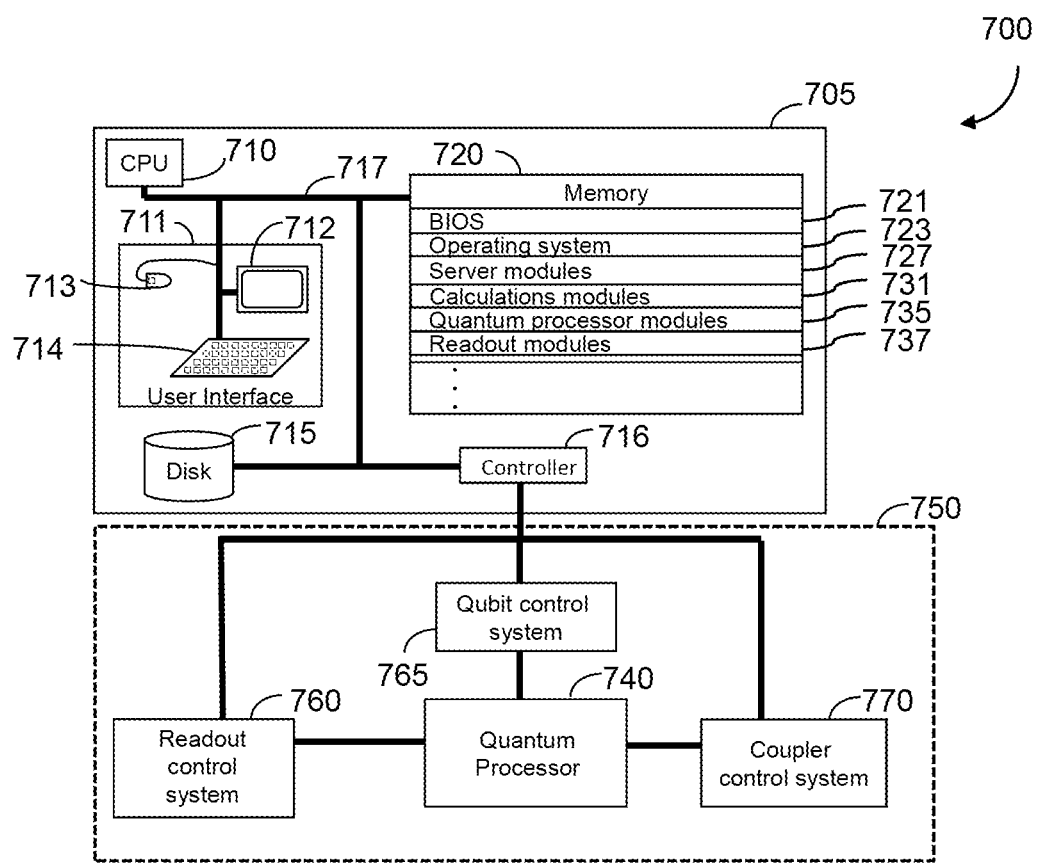
FIG. 7 is a schematic diagram of an exemplary hybrid computing system, including a digital computer and a quantum computer, that may incorporate FMR technology as described herein.

FIG. 7 shows a hybrid computing system 700 according to at least one exemplary implementation, including a digital computer 705 and a quantum computer 750, that may incorporate FMR technology as described above.

Digital computer 705 comprises CPU 710, user interface elements 711, 712, 713 and 714, disk 715, controller 716, bus 717 and memory 720. Memory 720 comprises modules 721, 723, 727, 731, 737 and 735.

Quantum computer 750 comprises quantum processor 740, readout control system 760, qubit control system 765 and coupler control system 770. Quantum computer 750 can incorporate FMR technology comprising superconducting resonators (such as superconducting resonator 210a of FIG. 2A). Computing system 700 can comprise a readout system such as readout system 500 of FIG. 5.

Figure 8:
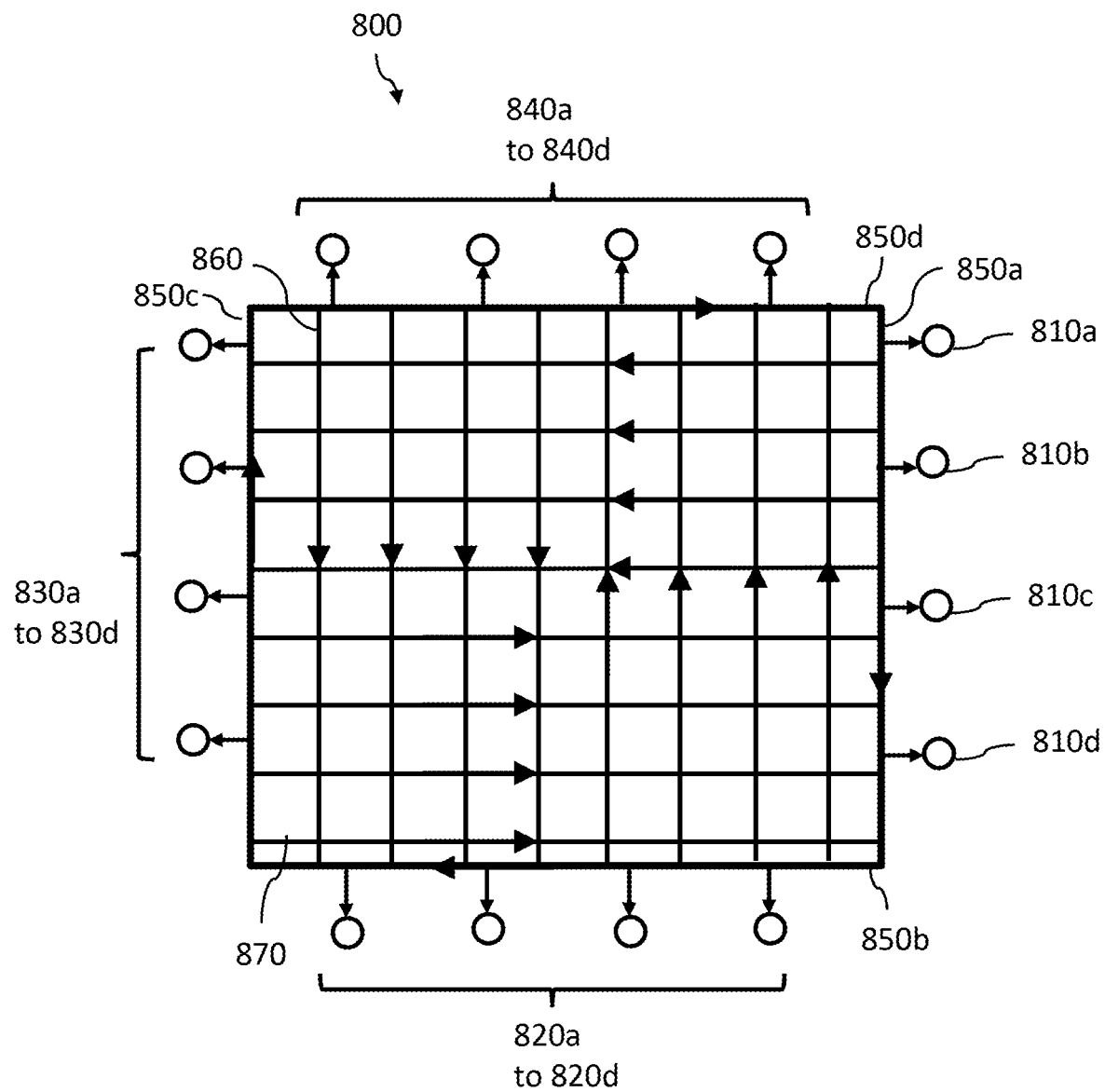
FIG. 8 is a schematic diagram illustrating a first arrangement of superconducting resonators in an example embodiment of a superconducting quantum processor.

FIG. 8 shows a first arrangement of superconducting resonators in an example implementation of a superconducting quantum processor 800. Processor 800 comprises 64 unit cells (not shown in FIG. 8) with four sets of superconducting resonators 810a through 810d, 820a through 820d, 830a through 830d, and 840a through 840d, coupled to outer shift registers 850a through 850d respectively. Each unit cell comprises N qubits. In one embodiment, N=8. Processor 800 comprises eight vertically oriented inner shift registers 860 and eight horizontally oriented inner shift registers 870.

All four set of superconducting resonators 810a through 810d, 820a through 820d, 830a through 830d, and 840a through 840d are coupled to a single common transmission line such as line 120 of FIG. 2A (not shown in FIG. 8).

Figure 9:
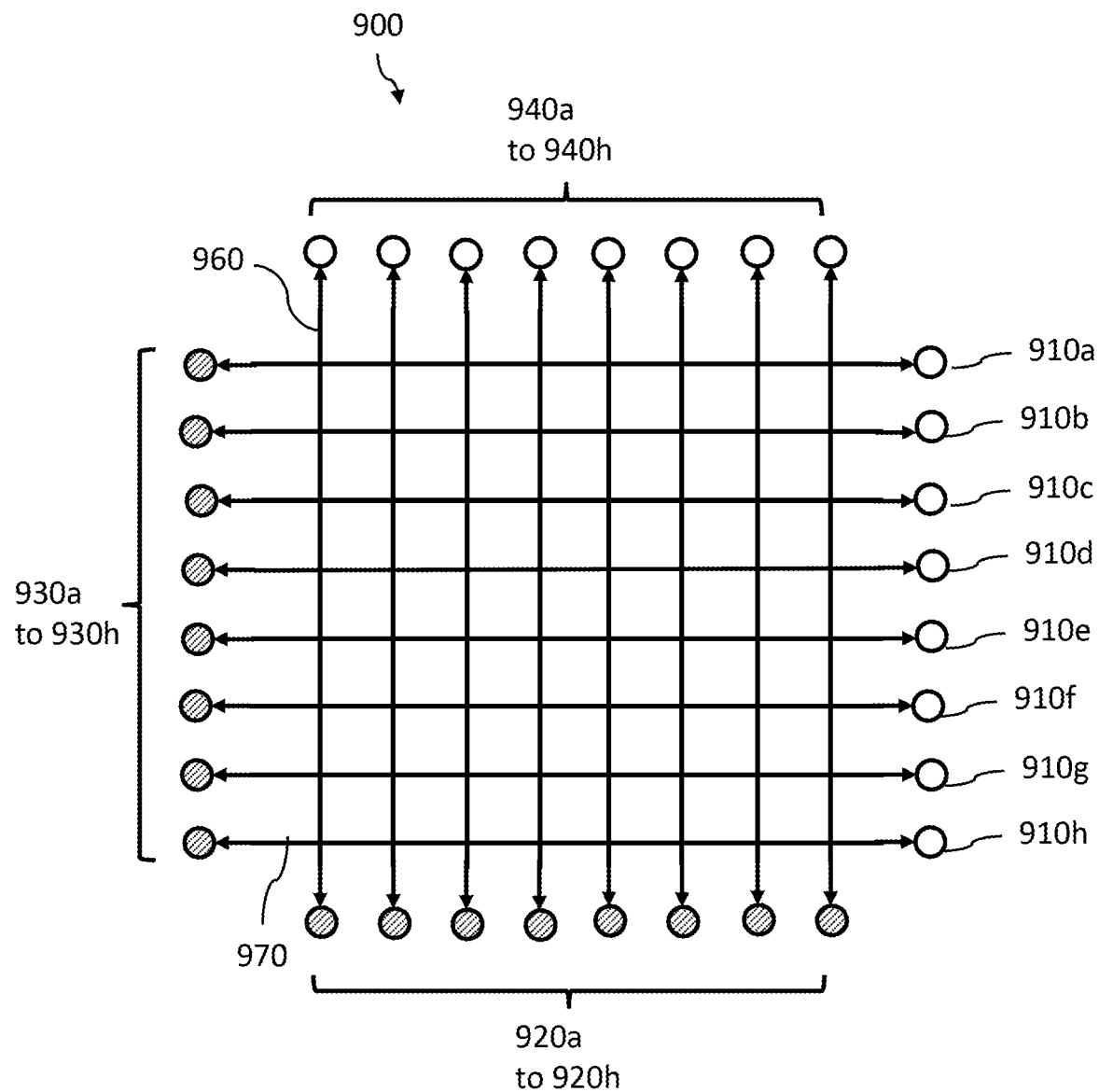
FIG. 9 is a schematic diagram illustrating a second arrangement of superconducting resonators in an example embodiment of a superconducting quantum processor.

FIG. 9 shows a second arrangement of superconducting resonators in an example implementation of a superconducting quantum processor 900. Processor 900 comprises 64 qubits (not shown in FIG. 9) with four sets of superconducting resonators 910a through 910h, 920a through 920h, 930a through 930h and 940a through 940h. Processor 900 comprises eight vertically oriented inner shift registers 960 and eight horizontally oriented inner shift registers 970.

Two sets of superconducting resonators 910a through 910h and 940a through 940h are coupled to a first transmission line such as line 120 of FIG. 2A (not shown in FIG. 9). The other two sets of superconducting resonators 920a through 920h and 930a through 930h (shown shaded in FIG. 9) are coupled to a second transmission line (also not shown in FIG. 9).

In the arrangement illustrated in FIG. 9, outer shift registers (such as outer shift registers 850a through 850d of FIG. 8) are not needed. With eight resonators on a side, one for each of the inner shift registers (horizontal or vertical), there is sufficient fault tolerance provided by the cross-over stages of the horizontally and vertically oriented inner shift registers.

High Q Superconducting Capacitor

It can be important for the performance of FMR systems and methods described above for the capacitance in the superconducting resonator (for example, capacitance 112 in resonator 210a of FIG. 2A) to have a high quality factor (Q).

A lumped element resonator can be implemented using an interdigitated capacitor or a transmission line resonator, fabricated directly on a crystalline dielectric. The resonator can be designed to reduce capacitor dielectric loss, for example by spreading the fingers of the interdigitated capacitor widely, and by causing the electric field to propagate through the crystalline dielectric rather than be exposed to surface oxides that can dominate the loss.

A disadvantage of existing techniques to fabricate high Q superconducting capacitors is that those techniques cannot readily be integrated in a heterogeneous, multi-layer fabrication stack while maintaining low loss.

One approach is to use a distributed microstrip resonator fabricated with amorphous silicon as a deposited dielectric. A disadvantage of this approach is that the capacitance is spread out along the length of the resonator and incorporates a larger volume of dielectric than an equivalent parallel plate capacitor, resulting in higher losses than for a lumped element parallel plate capacitor. Another disadvantage is that the microstrip resonator has a large distributed inductance that needs to be accounted for during design.

The technology described in this disclosure comprises a superconducting parallel plate capacitor with a thin, high-permittivity dielectric. A parallel-plate design with a thin dielectric can reduce the volume of dielectric for a given capacitance value. It can also provide a reduced capacitor footprint which is an advantage because chip space is at a premium.

A benefit of a parallel-plate capacitor with a thin dielectric layer is that it can decrease the microwave power required to saturate the loss centers in the dielectric, and consequently can allow high resonator quality factors to be achieved at the operating power typically used with FMR technology. The inventors have observed that decreasing the volume of lossy dielectric can lead to a decrease in the required power to saturate a superconducting resonator such as superconducting resonator 110 of FIG. 1A.

Reducing the thickness of the dielectric can be challenging. Furthermore, the capacitance can be sensitive to variations in the thickness of the dielectric. Variations in thickness can be introduced during fabrication, for example during planarization of the dielectric. A method for producing a superconducting parallel plate thin-layer capacitor that can be integrated in a heterogeneous multi-layer planarized fabrication stack with deposited dielectrics is described in the next section.

Thin-layer Capacitor Integration Process

FIGS. 10A to 10F are each respective cross-sectional views of a superconducting integrated circuit 1000 at sequential phases of a fabrication process, according to one illustrated embodiment. The sequence of FIGS. 10A to 10F defines a method for fabricating a thin-layer capacitor suitable for use in a superconducting resonator such as superconducting resonator 210a of FIG. 2A.

Figure 10A:
FIGS. 10A to 10F are each respective cross-sectional views of a superconducting integrated circuit at sequential phases of a fabrication process, according to one illustrated embodiment.

As illustrated in FIG. 10A, semiconductor fabrication equipment deposits a trilayer 1005. Trilayer 1005 comprises a first layer 1010 of a superconducting metal, a layer 1020 of a dielectric and a second layer 1030 of a superconducting metal. In one implementation, the first and second layers 1010 and 1030, respectively, of superconducting metal comprise niobium. In other implementations, the first and second layers 1010 and 1030, respectively, comprise Al, TiN, or WSi. Layer 1020 can comprise Si, SiN, amorphous SiH or other suitable inter-layer low-loss dielectric.

Figure 10B:
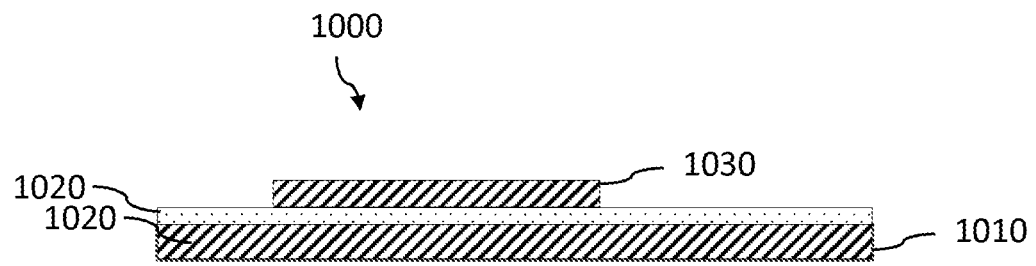

As illustrated in FIG. 10B, semiconductor fabrication equipment patterns trilayer 1005 using an etch process. Layer 1030 of superconducting metal can be removed during patterning except where the upper plate of the thin-layer capacitor is needed.

Figure 10C:
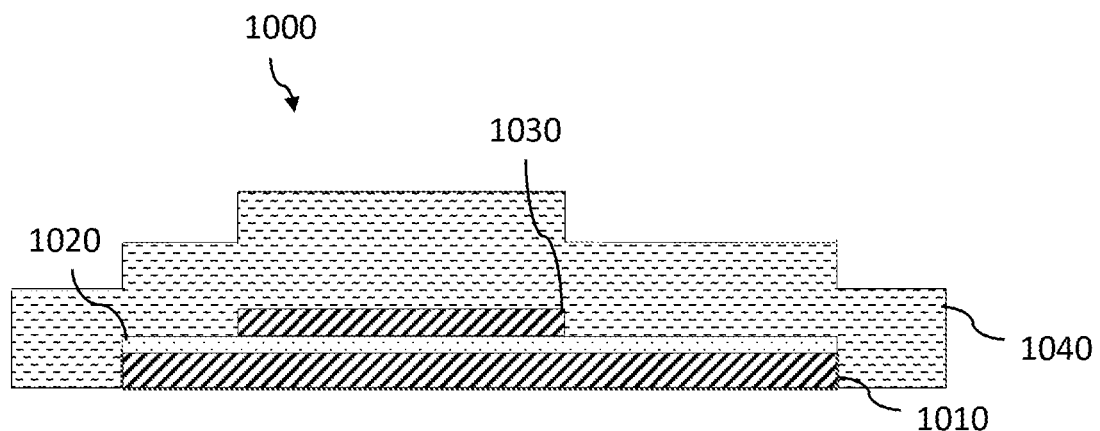

As illustrated in FIG. 10C, semiconductor fabrication equipment deposits a relatively thick layer 1040 of dielectric. In one embodiment, layer 1040 comprises SiO2.

Figure 10D:
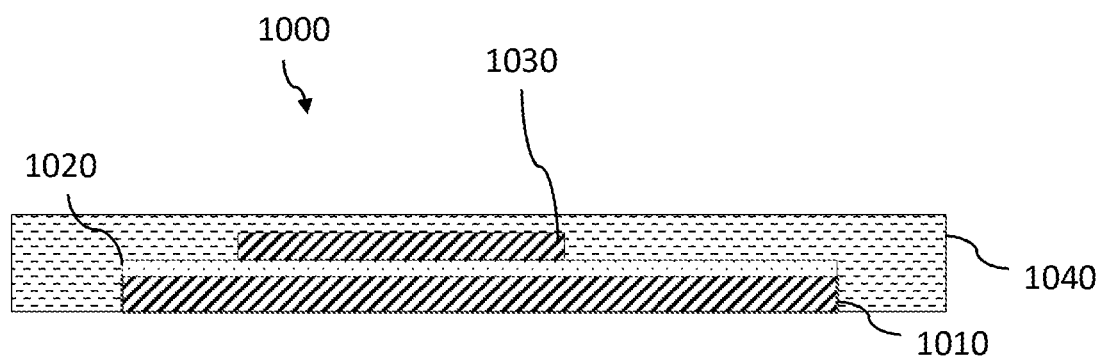

As illustrated in FIG. 10D, semiconductor fabrication equipment planarizes layer 1040 (e.g., CMP).

Figure 10E:
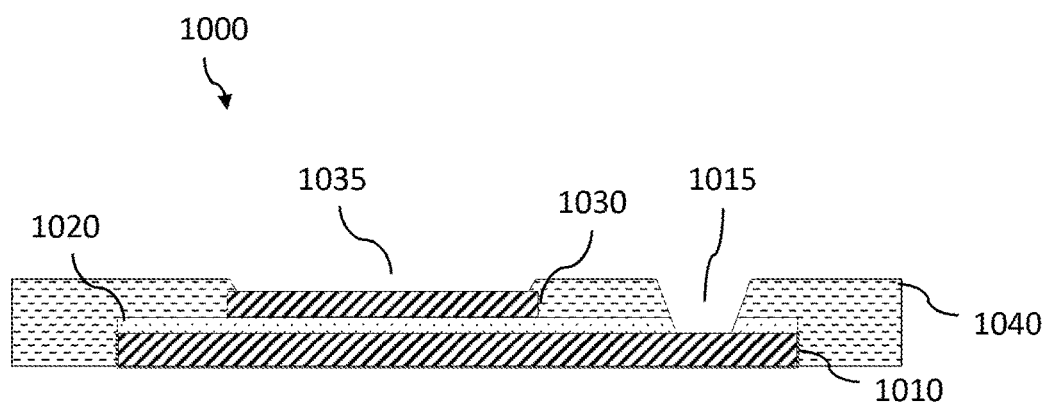

As illustrated in FIG. 10E, semiconductor fabrication equipment is used to etch vias 1015 and 1035. Via 1015 is a via to the first layer 1010 of superconducting metal, and is a via to the lower plate of the thin-layer capacitor. Via 1035 is a via to the second layer 1030 of superconducting metal, and is a via to the upper plate of the thin-layer capacitor.

Figure 10F:
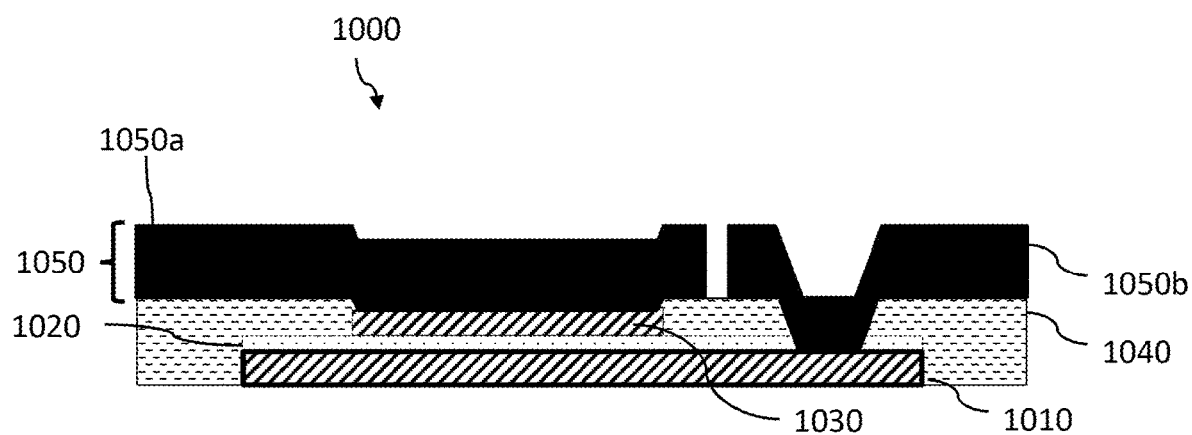

As illustrated in FIG. 10F, semiconductor fabrication equipment deposits a third layer 1050 of superconducting metal. The third layer 1050 of superconducting metal may, for example, comprise niobium. Semiconductor fabrication equipment patterns third layer 1050 to form a first region 1050*a* and a second region 1050*b*. First region 1050*a* can be a contact to the upper plate of the thin-layer capacitor, and second region 1050*b* can be a contact to the lower plate of the thin-layer capacitor. First region 1050*a* and second region 1050*b* can be electrically isolated from each other. First region 1050*a* and second region 1050*b* are a first portion of third layer 1050 and a second portion of third layer 1050, respectively.

In one implementation, the thickness of each of the first and second layers of superconducting metal 1010 and 1030, respectively, is about 300 nm, and the thickness of dielectric layer 1020 is about 50 nm.

An advantage of the method described above is that dielectric layer 1020 can be sufficiently thin that parasitic capacitance in regions of the circuit other than at the capacitors is relatively small.

Frequency Multiplexed Resonator Transceiver

Figure 11A:
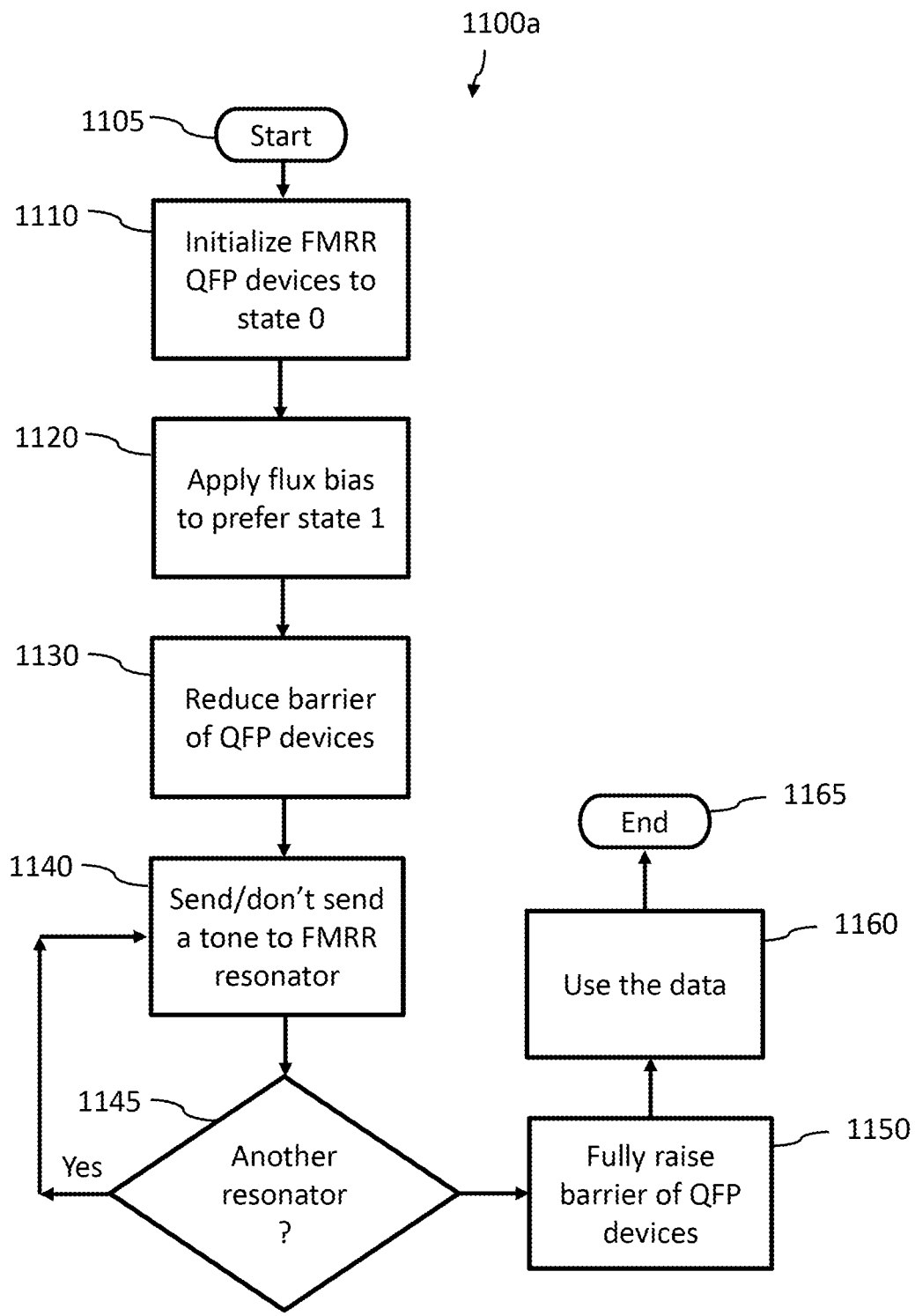
FIG. 11A is a flow chart illustrating a method for using frequency multiplexed resonator technology to transmit data to a superconducting device according to at least one implementation.

FIG. 11A is a flow chart illustrating a method 1100*a* for using frequency multiplexed resonator technology to transmit data to a superconducting device, according to at least one exemplary implementation. The superconducting device can, for example, be an element of a superconducting classical processor. Alternatively, the superconducting device can, for example, be an element of a superconducting quantum processor.

In one implementation, method 1100 is executed by a computing system, such as a hybrid computing system comprising a digital computer and an analog computer. Method 1100 includes acts 1105-1165, though those skilled in the art will appreciate that in alternative implementations certain acts may be omitted and/or additional acts may be added. Those skilled in the art will appreciate that the order of the acts is shown for exemplary purposes only and may change in alternative implementations.

At 1110, the computing system initializes the QFP devices to a "0" state. At 1120, the computing system applies a flux bias using a flux bias line such as flux bias line 155 of FIGS. 12 through 14 to create a preference for a "1" state. At 1130, the computing system reduces the barrier of the QFP devices. At 1140, the computing system decides whether to send a tone to a frequency multiplexed resonator, and, if so, sends the tone to the resonator. The presence of a tone allows the QFP to relax into the "1" state. The absence of a tone causes the QFP to stay in the "0" state.

At 1145, the computing system determines if there is another resonator. If the computing system determines there is another resonator at 1145, then method 1100 returns to 1140. Method 1100 successively loops around 1140 and 1145 until there are no more resonators to consider, and method 1100 proceeds to 1150.

At 1150, the computing system fully raises the barrier of each of the QFP devices. At 1160, the quantum processor uses the data, for example through classical QFP logic. Using the data can include transferring the data to a superconducting processor via a shift register, for example. Method 1100 ends at 1165, for example until called or invoked again.

Figure 11B:
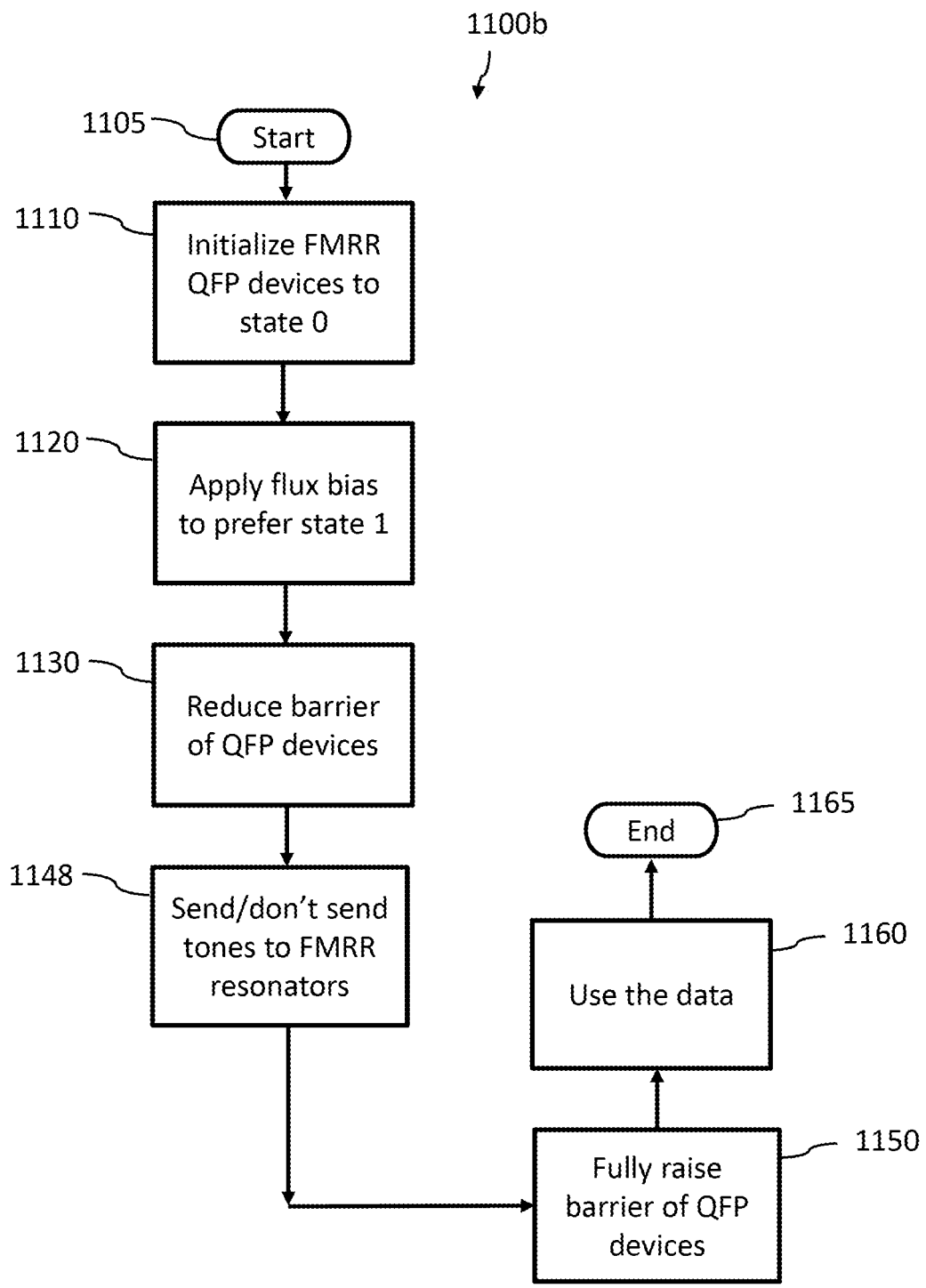
FIG. 11B is a flow chart illustrating a method for using frequency multiplexed resonator technology to transmit data to a superconducting device according to at least another implementation.

FIG. 11B is a flow chart illustrating a method 1100*b* for using frequency multiplexed resonator technology to transmit data to a superconducting device according to another exemplary implementation. Acts 1140 and 1145 of FIG. 11A can be combined into a single act 1148 as shown in FIG. 11B. With reference to FIG. 11B, at 1148, the computing system decides whether to send a tone to each of the superconducting resonators, and then transmits a microwave signal via the transmission line to all the superconducting resonators. The frequency multiplexed microwave signal stimulates the superconducting resonators in parallel.

The present technology can load data into a shift register on a quantum processor chip using a frequency multiplexed resonator. The frequency multiplexed resonator readout described above (with reference to FIGS. 1A, 1B, 1C, 2A, 2B, 2C, 3, 4, 5, and 6) can be run in reverse to allow data to be passed to the processor. In some implementations, the first stage QFP can be used to rectify a microwave signal in the resonator if a signal is present.

The present technology can be used to input data to the processor as well as to readout qubit states from the processor. The same lines can be used for both input and readout.

In some implementations, the device can reduce, or minimize, the impact of microwave currents in the resonator on the attached QFP. To circumvent this, a large SENSE SQUIDflux bias can be used to break the symmetry of the device, to allow a microwave flux signal to bias the body of the QFP. In another approach, a portion of the resonator inductance can be used to bias the QFP directly with the resonator current. A benefit of the latter approach is that it can separate the DC flux coupling between the QFP and the SENSE SQUID from the microwave flux coupling between the resonator and the body of the QFP.

Once the data is loaded, the QFP can be read out immediately. The data can be loaded with up to 100% fidelity. Errors can be corrected by repeating the loading sequence.

Figure 12:
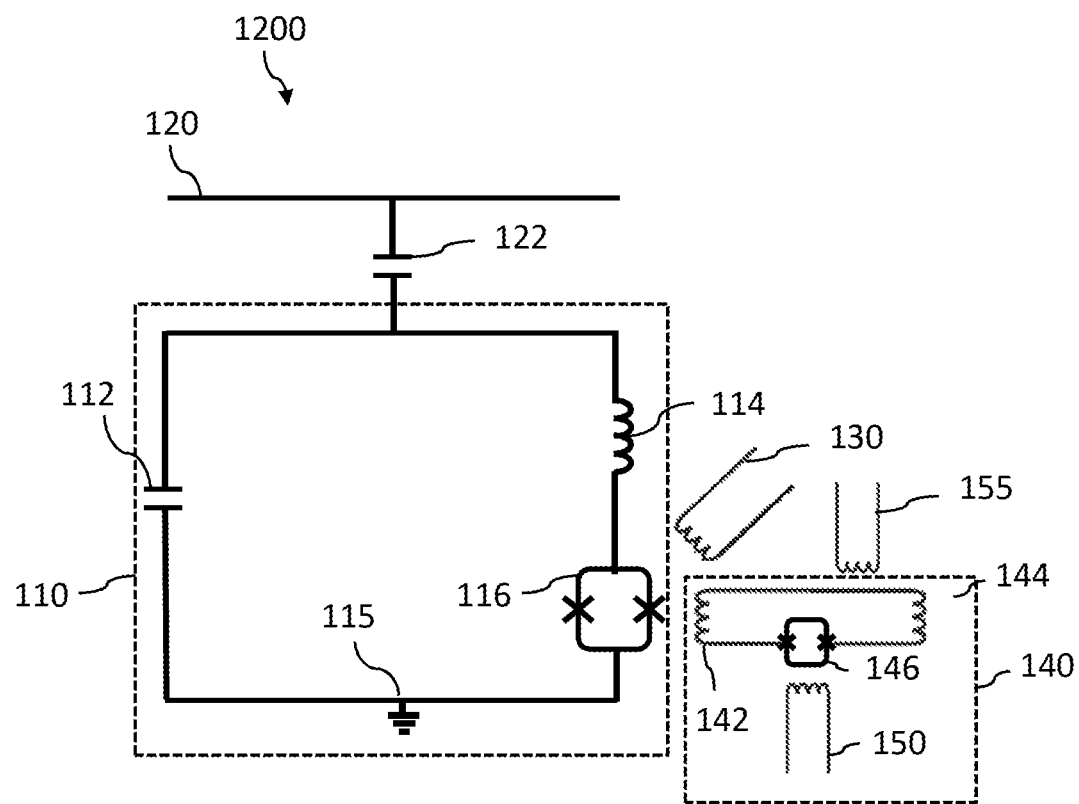
FIG. 12 is a schematic diagram illustrating a frequency multiplexed resonator transceiver according to at least one exemplary implementation.

FIG. 12 is a schematic diagram illustrating a superconducting transceiver circuit 1200 according to at least one exemplary implementation. Superconducting transceiver circuit 1200 comprises a superconducting resonator able to tune a resonator frequency. Superconducting transceiver circuit 1200 is operable as a frequency multiplexed resonator transceiver.

Superconducting transceiver circuit 1200 comprises the elements described above in reference to FIG. 1A, and further comprises a flux bias line 155 operable to apply a flux bias to the last or final shift register stage 140. Shift register stage 140 can, for example, comprise a QFP, and can be communicatively coupled to superconducting resonator 110 for the purposes of reading out the state of a superconducting device and/or loading data into a superconducting device.

In one implementation, data can be loaded into a shift register via the last or final shift register stage 140, and the shift register can be communicatively coupled to a Digital to Analog Converter (DAC) (not shown in FIG. 12). In one implementation, the DAC can be used to apply a bias to a superconducting qubit.

Figure 13A:
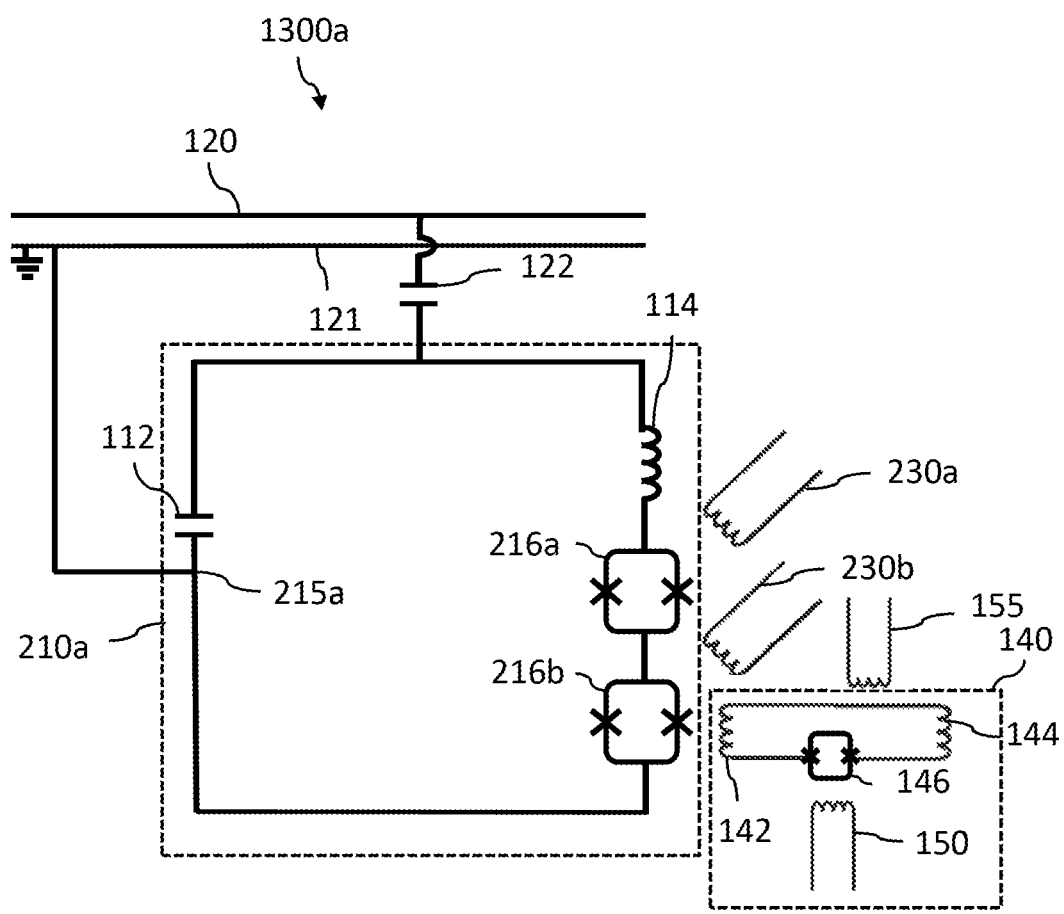
FIG. 13A is a schematic diagram illustrating a frequency multiplexed resonator transceiver comprising a superconducting resonator with two SQUID loops according to at least one exemplary implementation.

FIG. 13A is a schematic diagram illustrating a superconducting transceiver circuit 1300a comprising a superconducting resonator with two SQUID loops according to at least one exemplary implementation. Superconducting transceiver circuit 1300a is operable as a frequency multiplexed resonant transceiver.

As described with reference to FIG. 2A, SQUID loops 216a and 216b advantageously enable independent tuning of the resonance frequency and the sensitivity of superconducting resonator 210a by adjusting the flux bias in SQUID loops 216a and 216b.

Components of superconducting transceiver circuit 1300a labeled with the same numbers as in superconducting circuit 100 of FIG. 1A are similar or even identical to those described in reference to FIG. 1A. For example, capacitance 112 of superconducting circuit 1300a can be a parallel plate capacitor, and inductance 114 of superconducting circuit 1300a can be a niobium spiral inductor.

As described with reference to FIG. 2A, interfaces 230a and 230b can provide flux bias to SQUID loops 216a and 216b respectively. Once a suitable operating point has been found (see below), the flux biases provided by interfaces 230a and 230b can be static. This advantageously allows the circuit to use an array of flux DACs requiring only a few wires to program. The two tunable SQUID loops 216a and 216b do not need an independent analog control line for each superconducting resonator 210a.

Superconducting transceiver circuit 1300a comprises the elements of FIG. 2A. Superconducting transceiver circuit 1300a further comprises an interface 155 operable to apply a flux bias to QFP 140, as described with reference to FIG. 11.

Figure 13B:
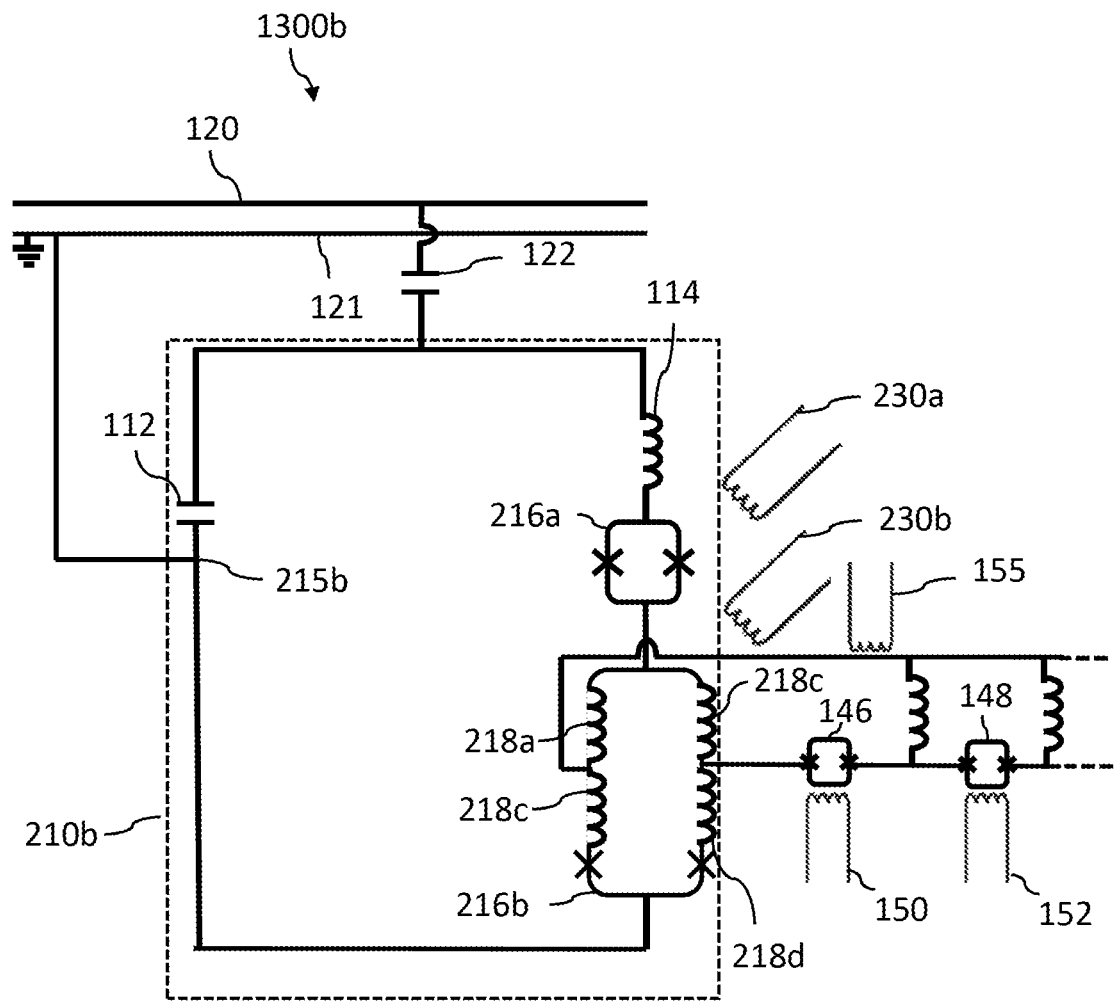
FIG. 13B is a schematic diagram illustrating a frequency multiplexed resonator transceiver comprising a superconducting resonator with two SQUID loops according to at least another exemplary implementation.

FIG. 13B is a schematic diagram illustrating a superconducting transceiver circuit 1300b comprising a superconducting resonator with two SQUID loops according to at least another exemplary implementation. Superconducting transceiver circuit 1300b is operable as a frequency multiplexed resonant transceiver.

Superconducting transceiver circuit 1300b comprises the elements of FIG. 2B. Superconducting transceiver circuit 1300b further comprises an interface 155 operable to apply a flux bias to a last stage QFP 140a, as described with reference to FIG. 11.

In the example embodiment of FIG. 13B, the coupling between SQUID loop 216b (known as the SENSE SQUID) and last stage QFP 140a is galvanic coupling. When there is no flux in the SENSE SQUID, microwave current will be evenly split on both sides of the SQUID. Since the galvanic coupling to the QFP is symmetric, the result is zero flux coupling into last stage QFP 140a. The symmetry can be broken by introducing a large flux bias into the SENSE SQUID. The circulating current will combine with the microwave current in a manner that depends on the non-linearity of the SQUID junctions. The result can be a net flux signal into last stage QFP 140a.

In another exemplary implementation, the resonator is coupled directly to the QFP. The coupling is sufficient to load the QFP deterministically when in a metastable state while not destroying data when in a fully latched state.

In at least one exemplary implementation, the superconducting device is stimulated after partial annealing (reduction of the barrier) at the resonant frequency.

In another exemplary implementation, the resonator is stimulated after partial annealing using a fast sweep by a Vector Network Analyzer (VNA). The sweep of the VNA can be centered, or least approximately centered, on the resonance frequency of the resonator. The bandwidth of the sweep can be set to a value that is less than the resonator linewidth, and the sweep can use a handful of points within the resonance. The bandwidth of the sweep can be selected to avoid, or at least reduce, overlap with the linewidth of an adjacent resonance.

In an example implementation, the sweep can be achieved with a trigger signal output from a DAC card, and sent to the VNA. The waveform can include a sufficiently long delay to allow the sweep to finish before full annealing and readout. For example, the delay can be a few milliseconds.

Figure 13C:
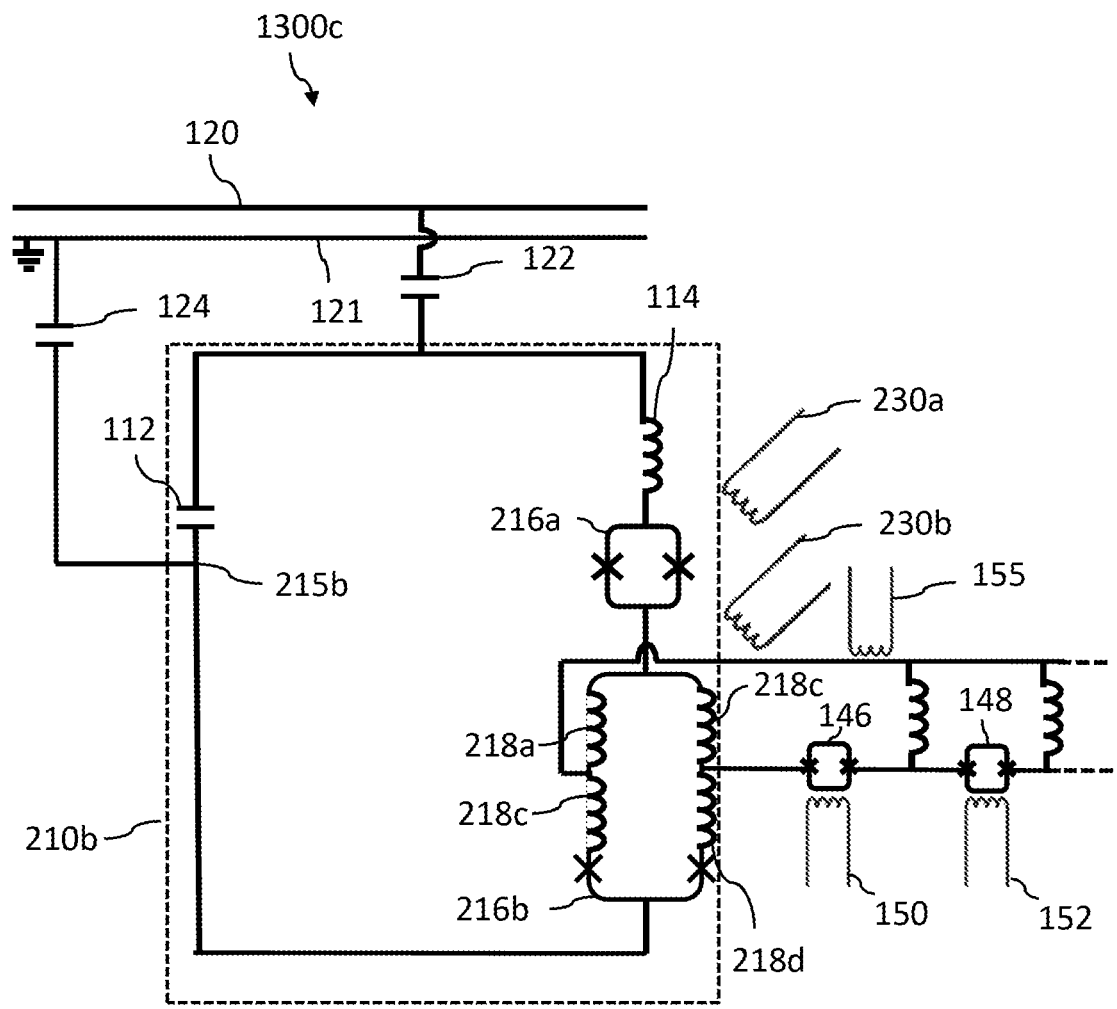
FIG. 13C is a schematic diagram illustrating a frequency multiplexed resonator transceiver comprising a superconducting resonator with two SQUID loops according to at least another exemplary implementation.

FIG. 13C is a schematic diagram illustrating a superconducting transceiver circuit 1300c comprising a superconducting resonator with two SQUID loops according to at least another exemplary implementation. Superconducting transceiver circuit 1300c is operable as a frequency multiplexed resonator transceiver, and is able to tune the resonator frequency and sensitivity independently of each other.

Superconducting transceiver circuit 1300c comprises the elements of FIG. 2C. Superconducting transceiver circuit 1300c further comprises an interface 155 operable to apply a flux bias to a last stage QFP 140a, as described with reference to FIG. 11.

Superconducting transceiver circuit 1300c is connected at node 215c to the ground 121 of transmission line 120 via a coupling capacitor 124. In other respects, superconducting transceiver circuit 1300c is the same as or similar to superconducting transceiver circuit 1300b.

Components of superconducting transceiver circuits 1300a, 1300b, and 1300c of FIGS. 13A, 13B, and 13C, respectively, labeled with the same numbers as in superconducting circuit 100 of FIG. 1A can be similar or even identical to those as described in reference to FIG. 1A. For example, capacitance 112 of superconducting circuits 1300a, 1300b, and 1300c can be a parallel plate capacitor, and inductance 114 of superconducting transceiver circuits 1300a, 1300b, and 1300c can be a niobium spiral inductor.

In superconducting transceiver circuits 1300a, 1300b, and 1300c, superconducting resonator 210a is connected at node 215a to ground, for example to the ground 121 of transmission line 120. In superconducting transceiver circuit 1300c, superconducting resonator 210a is connected at node 215a to ground via capacitor 124.

Figure 14:
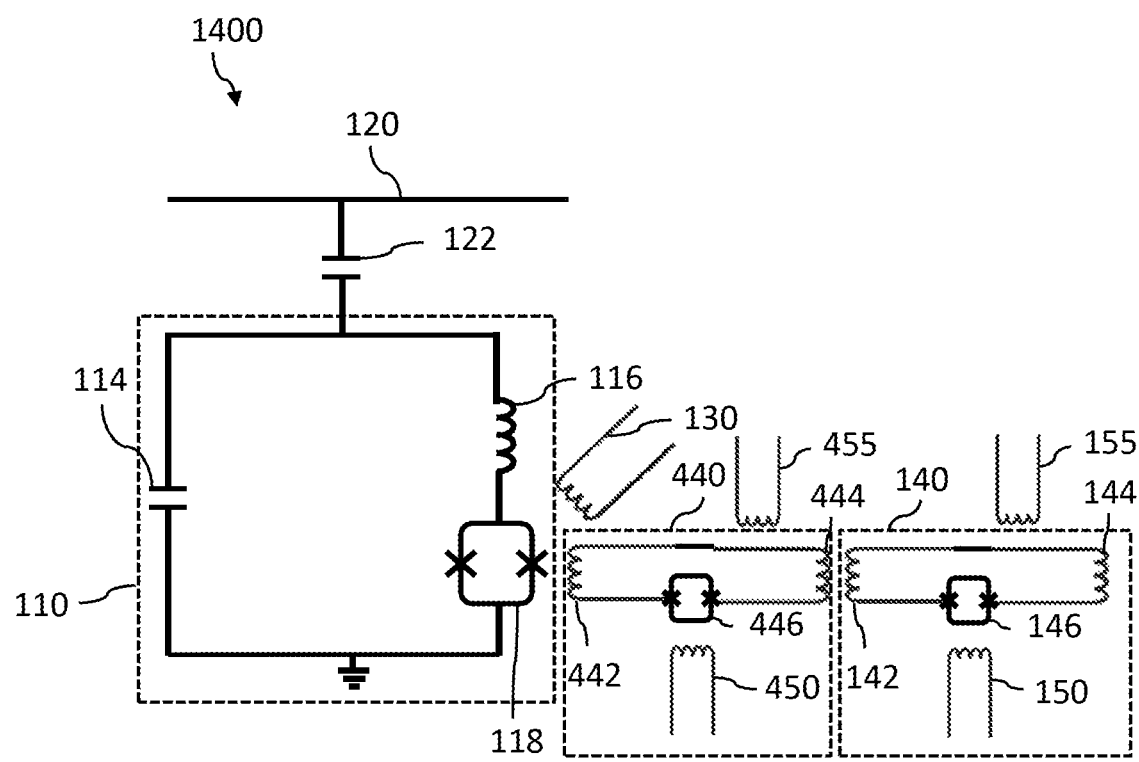
FIG. 14 is a schematic diagram illustrating a frequency multiplexed resonator transceiver comprising the superconducting resonator of FIG. 12.

FIG. 14 is a schematic diagram illustrating an example embodiment of a superconducting transceiver circuit 1400 comprising superconducting resonator 110 of FIG. 12. Superconducting transceiver circuit 1400 is operable as a frequency multiplexed resonator transceiver, and is advantageously operable to independently tune the resonator frequency and sensitivity. Superconducting transceiver circuit further comprises interface 130 and last or final shift register stage 140, both as described with reference to FIG. 1A.

Superconducting transceiver circuit 1400 comprises the elements of superconducting circuit 400 of FIG. 4. Superconducting transceiver circuit 1400 further comprises a tunable coupler 440 in between superconducting resonator 110 and last or final shift register stage (or QFP) 140. Superconducting transceiver circuit 1400 enables independent tuning of the resonance frequency and the sensitivity to QFP flux, provided the variable loading of superconducting resonator 110 by tunable coupler 440 is taken into account.

Tunable coupler 440 comprises, for example, inductances 442 and 444, and DC SQUID 446.

Superconducting transceiver circuit 400 further comprises interface 450 operable to apply a flux bias to tunable coupler 440, and thereby to adjust the strength of coupling between SQUID loop 216b and last stage QFP 140.

In some embodiments, the frequency multiplexed resonator input system described above, which can be used to input data to superconducting devices, is used in combination with the frequency multiplexed resonator readout system also described in the present disclosure (with reference to FIGS. 1A, 1B, 1C, 2A, 2B, 2C, 3, 4, 5, and 6). In other embodiments, the frequency multiplexed resonator input system described above is used in combination with other readout systems or circuits. For example, in one of the other embodiments, the frequency multiplexed resonator input system is used in combination with the superconducting flux qubit readout system described in U.S. Pat. No. 8,854,074.

An example embodiment of a frequency multiplexed resonator input/output system is illustrated in FIG. 5 (described above with reference to the readout system). The return pathway in FIG. 5 comprises DC block 585, circulators 584 and 583, amplifiers 575, 566, 564, and 562, attenuator 570, mixer 560, filters 527*a* and 527*b,* and ADC 526*a* and 526*b.* If the system is to be used for inputting data to the superconducting devices only (and no readout), then the return pathway is not required.

The various embodiments described above can be combined to provide further embodiments. To the extent that they are not inconsistent with the specific teachings and definitions herein, all of the U.S. patents, U.S. patent application publications, U.S. patent applications, foreign patents, foreign patent applications and non-patent publications referred to in this specification and/or listed in the Application Data Sheet, including but not limited to the following U.S. Provisional Patent Application No. 62/161,780, filed May 14, 2015; U.S. Provisional Patent Application No.: 62/288,251, filed Jan. 28, 2016; U.S. Pat. Nos. 8,854,074; and 8,169,231, are incorporated herein by reference, in their entireties. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting input/output system comprising:
    a microwave transmission line;
    at least one microwave superconducting resonator communicatively coupled to the microwave transmission line, each microwave superconducting resonator respectively comprising:
        a capacitance coupled between the microwave transmission line and a first node via a superconductive path;
        an inductance coupled between the microwave transmission line and the first node via a superconductive path, the inductance in parallel with the capacitance of the respective microwave superconducting resonator;
        a first DC superconducting quantum interference device (SQUID) coupled between the inductance and the first node via a superconductive path, in parallel with the capacitance of the respective microwave superconducting resonator and in series with the inductance of the respective microwave superconducting resonator; and
        a second DC superconducting quantum interference device (SQUID) coupled between the first DC SQUID and the first node via a superconductive path, in parallel with the capacitance of the respective microwave superconducting resonator and in series with the inductance of the respective microwave superconducting resonator and in series with the first DC SQUID of the respective microwave superconducting resonator;
    a first interface inductively coupled to the first DC SQUID and selectively operable to apply a first flux bias to the first DC SQUID; and
    a second interface inductively coupled to the second DC SQUID and selectively operable to apply a second flux bias to the second DC SQUID, wherein the second DC SQUID is communicatively coupled to a Quantum Flux Parametron (QFP).

2. The superconducting input/output system of claim 1 wherein the second DC SQUID is inductively coupled to the QFP.

3. The superconducting input/output system of claim 1 wherein the QFP is a shift register and the second DC SQUID is communicatively coupled to an endpoint of the shift register, the shift register comprising a plurality of stages.

4. The superconducting input/output system of claim 3 wherein the at least one microwave superconducting resonator comprises a plurality of microwave superconducting resonators, each of the plurality of microwave superconducting resonators communicatively coupled to the microwave transmission line.

5. The superconducting input/output system of claim 1 wherein the superconducting input/output system is a frequency multiplexed resonator transceiver selectively operable to readout data from the QFP and load data into the QFP.

6. The superconducting input/output system of claims 1 further comprising:
    a microwave subsystem operable to generate a microwave signal for transmission on the microwave transmission line, and operable to receive a microwave signal via the microwave transmission line, the microwave subsystem comprising:
        a pair of complex mixers, a first one of the complex mixers communicatively coupled to the at least one DAC and a second one of the complex mixers communicatively coupled to the at least one ADC;
        a reference microwave signal generator communicatively coupled to provide a reference microwave signal to at least one of the complex mixers;
        a programmable attenuator communicatively coupled to the complex mixers; and
        a microwave switch operable to control passage of the signals between the first one of the complex mixers and the programmable attenuator; and
    at least one amplifier communicatively coupled to receive a signal from the programmable attenuator.

7. The superconducting input/output system of claim 6 further comprising:
    a digital electronics subsystem operable to generate a baseband signal for input to the microwave subsystem, and operable to detect a baseband signal received from the microwave subsystem, the digital electronics subsystem comprising:
        a Field Programmable Gate Array (FPGA);
        at least one Digital-to-Analog Converter (DAC) communicatively coupled to an output of the FPGA; and at least one Analog-to-Digital Converter (ADC) communicatively coupled to an input of the FPGA.

8. The superconducting input/output system of claims 1 wherein the first flux bias applied by the first interface tunes the resonant frequency of the first microwave resonator, and the second flux bias applied by the second interface tunes the sensitivity of the first microwave resonator.

9. The superconducting input/output system of claim 8 wherein the third flux bias applied by the third interface causes partial annealing.

10. The superconducting input/output system of claim 9 wherein partial annealing includes lowering the potential barrier between two stable energy states of the QFP.

11. The superconducting input/output system of claims 1 wherein the capacitance comprises a parallel plate capacitor.

12. The superconducting input/output system of claims 1 wherein the inductance comprises a spiral inductor.

13. The superconducting input/output system of claims 1 wherein the superconducting input/output system includes a superconducting readout system operable to read out the states of one or more superconducting devices.

14. The superconducting input/output system of claim 13 wherein at least one of the one or more superconducting devices is a superconducting qubit.

15. The superconducting input/output system of claim 1 wherein the superconducting input/output system includes a superconducting data input system operable to load data into one or more superconducting devices.

16. The superconducting input/output system of claim 15 wherein at least one of the one or more superconducting devices is a DAC.

17. The superconducting input/output system of claim 1 wherein the QFP is a final stage of a shift register.

18. The superconducting input/output system of claims 17 wherein the shift register is communicatively coupled to a DAC.

19. The superconducting input/output system of claim 1 further comprising a third interface inductively coupled to the QFP and selectively operable to apply a third flux bias to the QFP.

* * * * *